(12) United States Patent
Kimura

(10) Patent No.: US 8,786,349 B2
(45) Date of Patent: Jul. 22, 2014

(54) SEMICONDUCTOR DEVICE, ELECTRONIC DEVICE HAVING THE SAME, AND DRIVING METHOD OF THE SAME

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/559,662

(22) Filed: Jul. 27, 2012

(65) Prior Publication Data

US 2012/0299885 A1 Nov. 29, 2012

Related U.S. Application Data

(60) Continuation of application No. 12/402,630, filed on Mar. 12, 2009, now Pat. No. 8,258,847, which is a division of application No. 10/769,853, filed on Feb. 3, 2004, now Pat. No. 7,528,643.

(30) Foreign Application Priority Data

Feb. 12, 2003 (JP) ................................ 2003-033051

(51) Int. Cl.
*H03K 5/08* (2006.01)

(52) U.S. Cl.
USPC ............................ 327/310; 327/318; 327/389

(58) Field of Classification Search
USPC .......................................... 327/310, 318, 389
See application file for complete search history.

(56) References Cited

U.S. PATENT DOCUMENTS

| 4,649,300 A | 3/1987 | Schutz |
| 4,758,801 A | 7/1988 | Draxelmayr |
| 5,729,165 A | 3/1998 | Lou et al. |
| 5,949,270 A | 9/1999 | Saito |
| 6,072,353 A | 6/2000 | Matsuzawa |
| 6,211,720 B1 | 4/2001 | Matsuzawa |
| 6,229,506 B1 | 5/2001 | Dawson et al. |

(Continued)

FOREIGN PATENT DOCUMENTS

| CN | 1139317 A | 1/1997 |
| EP | 142167 A2 | 5/1985 |

(Continued)

OTHER PUBLICATIONS

European Search Report (Application No. 04002477.0), Jun. 14, 2004, 4 pages.

(Continued)

*Primary Examiner* — Kenneth B. Wells
(74) *Attorney, Agent, or Firm* — Fish & Richardson P.C.

(57) ABSTRACT

A digital circuit which can operate normally regardless of binary potentials of an input signal is provided. A semiconductor device comprising a correcting unit and one or a plurality of circuit elements, the correcting unit including a first capacitor, a second capacitor, a first switch, and a second switch, wherein the first electrode of the first capacitor is connected to an input terminal, the supply of a first potential to the second electrode of the first capacitor is controlled by the first switch, the supply of a second potential to the second electrode of the second capacitor is controlled by the second switch, and a potential of the second electrode of the first capacitor or a potential of the second electrode of the second capacitor is supplied to the one or the plurality of circuit elements.

22 Claims, 18 Drawing Sheets

(56) References Cited

U.S. PATENT DOCUMENTS

| | | |
|---|---|---|
| 6,242,973 B1 | 6/2001 | Kong et al. |
| 6,313,819 B1 | 11/2001 | Maekawa et al. |
| 6,414,517 B1 | 7/2002 | Kim et al. |
| 6,522,323 B1 | 2/2003 | Sasaki et al. |
| 6,529,070 B1 | 3/2003 | Nagaraj |
| 6,535,021 B1 | 3/2003 | Song |
| 6,577,302 B2 | 6/2003 | Hunter et al. |
| 6,590,227 B2 | 7/2003 | Ishikawa |
| 6,603,456 B1 | 8/2003 | Aoki et al. |
| 6,624,698 B2 | 9/2003 | Nagaraj |
| 6,628,146 B2 | 9/2003 | Tam |
| 6,686,899 B2 | 2/2004 | Miyazawa et al. |
| 6,714,046 B2 | 3/2004 | Fujikawa et al. |
| 6,927,618 B2 | 8/2005 | Kimura et al. |
| 6,930,666 B2 | 8/2005 | Miyazawa et al. |
| 6,960,796 B2 | 11/2005 | Rhodes et al. |
| 7,122,438 B2 | 10/2006 | Sasaki |
| 7,123,237 B2 | 10/2006 | Sato et al. |
| 7,162,160 B2 * | 1/2007 | Aronson et al. ............... 398/137 |
| 7,355,582 B1 * | 4/2008 | Bell ................. 345/100 |
| 7,375,574 B2 * | 5/2008 | Kanno et al. ................... 327/333 |
| 7,411,318 B2 | 8/2008 | Kimura |
| 7,528,643 B2 | 5/2009 | Kimura |
| 7,531,379 B2 | 5/2009 | Rhodes et al. |
| 7,570,106 B2 * | 8/2009 | Kuramori et al. ............. 327/537 |
| 7,623,109 B2 | 11/2009 | Sato et al. |
| 7,696,026 B2 | 4/2010 | Moon |
| 2001/0028271 A1 | 10/2001 | Andre |
| 2003/0117352 A1 | 6/2003 | Kimura |
| 2003/0174009 A1 | 9/2003 | Kimura et al. |
| 2004/0085115 A1 | 5/2004 | Fujiyoshi et al. |
| 2004/0095159 A1 | 5/2004 | Kimura |
| 2004/0257117 A1 | 12/2004 | Kimura |
| 2005/0099068 A1 | 5/2005 | Kimura |
| 2006/0071895 A1 | 4/2006 | Miyazawa et al. |

FOREIGN PATENT DOCUMENTS

| | | |
|---|---|---|
| EP | 0 899 714 A2 | 3/1999 |
| EP | 1096671 A1 | 5/2001 |
| JP | 49-017161 A | 2/1974 |
| JP | 60-105320 A | 6/1985 |
| JP | 62-039912 A | 2/1987 |
| JP | 04-357710 A | 12/1992 |
| JP | 08-140020 A | 5/1996 |
| JP | 09-172367 A | 6/1997 |
| JP | 09-232938 A | 9/1997 |
| JP | 10-003789 A | 1/1998 |
| JP | 10-149678 A | 6/1998 |
| JP | 10-303732 A | 11/1998 |
| JP | 11-073165 A | 3/1999 |
| JP | 2000-134097 A | 5/2000 |
| JP | 2000-231089 A | 8/2000 |
| JP | 2001-068558 A | 3/2001 |
| JP | 2001-168705 A | 6/2001 |
| JP | 2001-177388 A | 6/2001 |
| JP | 2001-230637 A | 8/2001 |
| JP | 2001-249362 A | 9/2001 |
| JP | 2001-296818 A | 10/2001 |
| JP | 2002-057537 A | 2/2002 |
| JP | 2002-251174 A | 9/2002 |
| JP | 2002-319682 A | 10/2002 |
| JP | 2003-110419 A | 4/2003 |
| JP | 2004-205957 A | 7/2004 |

OTHER PUBLICATIONS

G. A. Cairns et al., "Multi-Format Digital Display with Content Driven Display Format," SID '01 Digest, 2001, pp. 102-105.

G. Cairns et al., "High Performance Circuitry for Poly-Silicon Integrated Drivers," EuroDisplay '99, Sep. 6-9, 1999, pp. 89-92.

H. Washio et al., "TFT-LCDs with Monolithic Multi-Drivers for High Performance Video and Low-Power Text Modes," SID '01 Digest, 2001, pp. 276-279.

Y. Kubota et al., "Late-News Paper: Low-Voltage Interface Technology for CGS TFT-LCD with Low Power Consumption," SID '99 Digest, 1999, pp. 1116-1119.

Office Action (Chinese Application No. 200410003979.4) dated Mar. 9, 2007 with English translation.

* cited by examiner period to accumulate charge into second capacitor 602 period to accumulate charge into first capacitor 601 period to perform normal operation

SEMICONDUCTOR DEVICE, ELECTRONIC DEVICE HAVING THE SAME, AND DRIVING METHOD OF THE SAME

CROSS REFERENCE TO RELATED APPLICATIONS

This application continuation of U.S. application Ser. No. 12/402,630, filed Mar. 12, 2009, now U.S. Pat. No. 8,258,847, which is a divisional of U.S. application Ser. No. 10/769,853, filed Feb. 3, 2004, now U.S. Pat. No. 7,528,643, which claims the benefit of a foreign priority application filed in Japan as Serial No. 2003-033051 on Feb. 12, 2003, all of which are incorporated by reference.

BACKGROUND OF THE INVENTION

1. Field of the Invention

The present invention relates to a digital circuit which operates in accordance with a digital signal, and more particularly to a semiconductor device having one or a plurality of the digital circuits and a driving method thereof.

2. Description of the Related Art

A logic circuit processing a digital signal (hereinafter referred to as a digital circuit) is configured with one or a plurality of logic elements as a basic unit. The logic element is the one which provides one output corresponding to one or a plurality of inputs. Examples of the logic elements include an inverter, an AND, an OR, a NOT, a NAND, a NOR, a clocked inverter, a transmission gate and the like.

The logic element is configured with one or a plurality of circuit elements such as a transistor, a resistor and a capacitor. By operating the plurality of the circuit elements in accordance with a digital signal which is inputted to the logic element, a signal potential or a current which is to be supplied to a subsequent circuit is controlled.

Given as an example herein is an inverter as one of the logic elements. A configuration and an operation thereof are described concretely below.

A circuit diagram of a general inverter is shown in FIG. 13A. In FIG. 13A, IN means an inputted signal (input signal), and OUT means an outputted signal (output signal). Also, VDD and VSS mean power supply potentials and VDD is higher than VSS (VDD>VSS).

The inverter shown in FIG. 13A comprises a p-channel transistor 1301 and an n-channel transistor 1302. The gate (G) of the p-channel transistor 1301 and the gate (G) of the n-channel transistor 1302 are connected to each other, and the input signal IN is inputted to each gate. VDD in supplied to the first terminal of the p-channel transistor 1301, and VSS is supplied to the first terminal of the n-channel transistor 1302. Meanwhile, the second terminal of the p-channel transistor 1301 and the second terminal of the n-channel transistor 1302 are connected to each other and the output signal OUT is outputted from these second terminals to a subsequent circuit.

Note that, either the first terminal or the second terminal of each transistor corresponds to the source and the other corresponds to the drain. In the case of a p-channel transistor, a terminal having a higher potential is the source and a terminal having a lower potential is the drain, and in the case of an n-channel transistor, a terminal having a lower potential is the drain and a terminal having a higher potential is the source. Therefore, the first terminals of both transistors correspond to the sources (S) and the second terminals thereof correspond to the drains (D) in FIG. 13A.

Generally, as an input signal, a digital signal having binary potentials is utilized. Two circuit elements of the inverter are operated in accordance with a potential of the input signal IN, thereby controlling a potential of the output signal OUT. Next, the operations of the inverter as shown in FIG. 13A are described with reference to FIGS. 13B and 13C. Note that, in the FIGS. 13B and 13C, each circuit element is shown merely as a switch for clarification of the operating state.

FIG. 13B shows the operating state of each circuit element when the input signal IN has a potential on the high potential side. Here, the potential on the high potential side of the input signal IN is referred to as VDD' (VDD'VDD), and to simplify the explanation, it is assumed that a threshold voltage of an n-channel transistor 1302 ($V_{THn}$) is equal or higher than 0 ($V_{THn}$ 0), and a threshold voltage of an p-channel transistor 1301 ($V_{THp}$) is equal or lower than 0 ($V_{THp} \leq 0$).

When the potential VDD' is supplied to the gate of the p-channel transistor 1301, its gate voltage becomes $V_{GS}$ 0 because VDD'VDD, and the p-channel transistor 1301 is thus turned OFF. Note that, the gate voltage corresponds to a voltage obtained by subtracting a potential of the source from a potential of the gate.

Meanwhile, when the potential VDD' is supplied to the gate of the n-channel transistor 1302, its gate voltage becomes $V_{GS}$>0 because VDD'>VSS, and the n-channel transistor 1302 is thus turned ON. Therefore, the power supply potential VSS is supplied to the subsequent circuit as a potential of the output signal OUT.

Next, the operating state of each circuit element when the input signal IN has a potential on the low potential side is shown in FIG. 13C. Here, the potential on the low potential side of the input signal IN is referred to as VSS' (VSS' VSS) and to simplify the explanation, it is assumed that a threshold voltage of the n-channel transistor 1302 ($V_{THn}$) is equal or higher than 0 ($V_{THn}$ 0), and a threshold voltage of the p-channel transistor 1301 ($V_{THp}$) is equal or lower than 0 ($V_{THp}$ 0).

When the potential VSS' is supplied to the gate of the n-channel transistor 1302, its gate voltage becomes $V_{GS}$ 0 because VSS' is equal or lower than VSS (VSS'VSS), and the n-channel transistor 1302 is thus turned OFF.

Meanwhile, when the potential VSS' is supplied to the gate of the p-channel transistor 1301, its gate voltage becomes $V_{GS}$<0 because VSS' is lower than VDD (VSS'<VDD), and the p-channel transistor 1301 is thus turned ON. Therefore, the power supply potential VDD is supplied to the subsequent circuit as a potential of the output signal OUT.

In this manner, each circuit element is operated in accordance with the potential of the input signal IN, thereby controlling the potential of the output signal OUT.

The operations of the inverter described above referring to FIGS. 13B and 13C axe the ones in the case where the binary potentials of the input signal IN (VDD' and VSS') are assumed to be in the relations of VDD' VDD, and VSS' VSS respectively. Hereinafter verified are the operations of the inverter as shown in FIG. 13A in the case of assuming that VDD' is lower than VDD (VDD'<VDD) and VSS' is higher than VSS (VSS'>VSS). Note that, VSS'<VDD' is satisfied.

First, the operating state of each circuit element when the input signal IN has a potential on the high potential side VDD' (VDD'<VDD) is shown in FIG. 14A. Here, to simplify the explanation, it is assumed that a threshold voltage of the n-channel transistor 1302 ($V_{THn}$) is equal or higher than 0 ($V_{THn}$ 0) and a threshold voltage of the p-channel transistor 1301 ($V_{THp}$) is equal or lower than 0 ($V_{THp}$ 0).

When the potential VDD' is supplied to the gate of the p-channel transistor 1301, its gate voltage becomes $V_{GS}$<0 because VDD'<VDD. Therefore, when $|V_{GS}|>|V_{THp}|$, the p-channel transistor 1301 is turned ON. Meanwhile, when the potential VDD' is supplied to the gate of the n-channel transistor 1302, its gate voltage becomes $V_{GS}>0$ because VDD' is higher than VSS (VDD'>VSS), thus the n-channel transistor 1302 is turned ON.

Therefore, as the p-channel transistor 1301 and the n-channel transistor 1302 are both turned ON, the potential of the output signal OUT does not become VSS even when the input signal IN has a potential on the high potential side, unlike the case shown in FIG. 13B.

A potential of the output signal OUT is determined by the current flowing in each transistor. In FIG. 14A, when $V_{GS}$ of the n-channel transistor 1302 is referred to as $V_{GSn}$ and $V_{GS}$ of the p-channel transistor 1301 is referred to as $V_{GSp}$, $|V_{GSn}|$ is larger than $|V_{GSp}|$ ($|V_{GSn}|>|V_{GSp}|$). Therefore, the potential of the output signal OUT approaches closer to VSS than VDD when there is almost no difference between each transistor as to characteristics and channel width-to-length ratio (W/L). However, the potential of the output signal OUT may approach closer to VDD than VSS depending on a mobility, a threshold voltage and the channel width-to-length ratio (W/L) of each transistor. In this case, the digital circuit does not operate normally, leading to a high possibility of a malfunction. Further, it can cause a sequential malfunction in the subsequent digital circuit.

FIG. 14B shows the operating state of each circuit element when the input signal IN has a potential on the low potential side VSS' (VSS'>VSS). To simplify the explanation, it is assumed that a threshold voltage of the n-channel transistor 1302 ($V_{THn}$) is equal or higher than 0 ($V_{THn} \geq 0$) and a threshold voltage of the p-channel transistor 1301 ($V_{THp}$) is equal or lower than 0 ($V_{THp} \leq 0$).

When the potential VSS' is supplied to the gate of the n-channel transistor 1302, its gate voltage becomes $V_{GS}>0$ because VSS' is higher than VSS (VSS'>VSS). Therefore, when $|V_{GS}|>|V_{THn}|$, the n-channel transistor 1302 is turned ON. Meanwhile, when the potential VSS' is supplied to the gate of the p-channel transistor 1301, its gate voltage becomes $V_{GS}<0$ because VSS' is lower than VDD (VSS'<VDD), thus the p-channel transistor 1301 is turned ON.

Therefore, the p-channel transistor 1301 and the n-channel transistor 1302 are both turned ON depending on the values of VSS, VSS' and $V_{THn}$. That means, unlike the case shown in FIG. 13C, a potential of the output signal OUT does not become VDD even when an input signal IN has a potential on the low potential side.

A potential of the output signal OUT is determined by the current flowing in each transistor. In FIG. 14B, when $V_{GS}$ of the n-channel transistor 1302 is referred to as $V_{GSn}$ and $V_{GS}$ of the p-channel transistor 1301 is referred to as $V_{GSp}$, $|V_{GSn}|$ is smaller than $|V_{GSp}|$ ($|V_{GSn}|<|V_{GSp}|$). Therefore, the potential of the output signal OUT approaches closer to VDD than VSS when there is almost no difference between each transistor as to characteristics and channel width-to-length ratio (W/L). However, the potential of the output signal OUT can approach closer to VSS than VDD depending on a mobility, a threshold voltage and channel width-to-length ratio (W/L) of each transistor. In this case, the digital circuit does not operate normally, leading to a high possibility of a malfunction. Further, it can cause a sequential malfunction in the subsequent digital circuit.

As described above, in the inverter shown in FIG. 13A, an output signal OUT having a desired potential is obtained when the binary potentials VDD' and VSS' of the input signal IN are in the relations of VDD' VDD, and VSS' VSS respectively, thus a normal operation is obtained. However, when the binary potentials VDD' and VSS' of the input signal IN are in the relations of VDD'<VDD, and VSS'>VSS respectively, the output signal OUT having a desired potential is not obtained, thus the inverter may not operate normally.

The above case is not exclusively limited to the inverter, but can also be applied to other digital circuits. That is, when the binary potentials of the input signal IN is out of the predetermined range, the circuit elements of the digital circuit malfunction. Therefore, the output signal OUT having a desired potential can not be obtained and the digital circuit does not function normally.

A potential of the input signal supplied from a circuit or a wiring of a prior stage is not always an appropriate value for the digital circuit to operate normally. In this case, by adjusting the potential of the input signal by a level shifter, the digital circuit can be operated normally. However, a high-speed operation of the semiconductor device is frequently hindered by using the level shifter, because level shifters generally have problems in that the speed of rising and dropping of the potential of the output signal is low as each of the circuit elements operate in conjunction with each other such that the operation of one circuit element triggers the operations of other circuit elements.

It is also difficult to obtain a high-speed operation because transistors are not easily turned ON when the power supply voltage is low whereby the current is also reduced. On the other hand, when the power supply voltage is increased to obtain a high-speed operation, the power consumption is also increased.

Further, the current consumption is also increased since the n-channel transistor 1302 and the p-channel transistor 1301 are simultaneously turned ON and thus a short-circuit current flows in the transistors.

To solve the foregoing problems, it is proposed that in a level shifter circuit having a first input inverter and a second output inverter, a DC level of a signal which is inputted to the second inverter from the first inverter is converted by capacitors and a bias means (Reference Patent Document 1: Japanese Patent Laid-Open No. Hei 09-172367). However, in this circuit, each DC level conversion capacitor which is connected between the output terminal of the first inverter and the gate of each transistor configuring the second inverter is connected to a High-level power supply potential or a Low-level power supply potential at all times by the bias means. Therefore, the charge and discharge of these capacitors have damaging influence on the dynamic characteristics of the circuit (namely, causes a decrease in operation speed of the circuit), or the power consumption due to the charge and discharge of the capacitors is notably increased. Meanwhile, when there are variations in a threshold voltage of each transistor, it is difficult to match electrostatic capacitance of each capacitor to its corresponding transistor. Therefore, voltages of both terminals of the DC level conversion capacitors do not match the threshold voltage of the corresponding transistors, thus ON/OFF operation of the transistors may not be performed normally.

SUMMARY OF THE INVENTION

The present invention has been made in view of the foregoing problems. It is an object of the invention to provide a digital circuit which can operate normally regardless of binary potentials of an input signal.

According to the invention, a digital circuit can be operated normally by storing in advance a difference between a potential of a signal which is actually inputted to the digital circuit and a potential which is required to operate the digital circuit normally, and by providing a correcting unit in the digital circuit which adds the potential difference to the potential of the signal which is actually inputted to the digital circuit so as to provide the corrected potential to circuit elements.

By using the correcting unit, an n-channel transistor can be turned OFF when a potential on the low potential side of the input signal is supplied thereto, and a p-channel transistor can be turned OFF when a potential on the high potential side of the input signal is supplied thereto. Therefore, the digital circuit can operate normally.

Shown in FIG. 1A is the configuration of the digital circuit of the invention. A digital circuit 100 comprises a correcting unit 101 which corrects a potential of an input signal IN, and one or a plurality of circuit elements 102 whose operations are controlled according to the input signal which has been corrected by the correcting unit 101. A potential of an output signal OUT is controlled according to the operation of the circuit element.

Shown in FIG. 1B is a schematic diagram showing the first configuration of the correcting unit 101 in the digital circuit of the invention. The correcting unit 101 of the first configuration comprises a capacitor 123 for correcting either potential on the high potential side or the low potential side of an input signal.

The correcting unit 101 further comprises a switch 130 for controlling the supply of a power supply potential 1 to the first electrode of the capacitor 123, and a switch 131 for controlling the supply of a second power supply potential 2 to the second electrode of the capacitor 123. Also, a switch 132 for controlling the supply of a potential of the input signal IN to the first electrode of the capacitor 123 is provided. The second electrode of the capacitor 123 is connected to an output terminal 140.

Note that, when correcting a potential on the high potential side of the input signal IN, the power supply potential 1 is set equal or lower than the power supply potential 2. Also, when correcting a potential on the low potential side of the input signal IN, the power supply potential 1 is set equal or higher than the power supply potential 2.

Furthermore, by controlling the switches 130 and 131, the potential difference between the power supply potential 1 and the power supply potential 2 can be stored and held in the capacitor 123.

By controlling the switch 132, a potential in which the potential difference held in the capacitor 123 is added to the input signal IN is inputted to the subsequent circuit element 102 when the potential of the input signal IN is supplied to the first electrode of the capacitor 123.

Therefore, a potential to be supplied to the circuit element 102 can be controlled by controlling the potential difference between the power supply potential 1 and the power supply potential 2 to bring it into a desired potential value. Thus, normal operations of the circuit element 102, and further of the digital circuit 100 are obtained.

Normal operation means an operation in the case where a potential of the output terminal for an input signal IN on the low potential side is almost equal to a potential of the output terminal when an input signal IN is equal to VSS. Also, the normal operation means an operation in the case where a potential of the output terminal for an input signal IN on the high potential side is almost equal to a potential of the output terminal when an input signal IN is equal to VDD. Note that, an operation can be considered as normal unless a subsequent digital circuit malfunctions.

Shown in FIG. 1C is a schematic diagram showing the second configuration of the correcting unit 101 in the digital circuit of the invention. The correcting unit 101 of the second configuration is the one which performs a correction by using a potential of the input signal in place of the power supply potential 1 shown in FIG. 1B. Specifically, the correcting unit 101 of the second configuration comprises a capacitor 103 for correcting a potential of the input signal IN.

Note that, a potential on the high potential side of the input signal IN is equal or lower than the power supply potential when correcting a potential on the high potential side of the input signal IN Also, a potential on the low potential side of the input signal IN is equal or higher than the power supply potential when correcting a potential on the low potential side of the input signal IN.

Therefore, the potential difference between the power supply potential and either potential on the high potential side or the low potential side of the input signal IN is stored in advance in the capacitor 103. The supply of the power supply potential to the capacitor 103 is controlled by a switch 108.

By the above configuration, a potential in which the potential difference stored in the capacitor 103 is added to the potential of the input signal IN is inputted to the subsequent circuit element 102.

Therefore, a potential to be supplied to the circuit element 102 can be controlled by controlling the potential difference between the input signal IN and the power supply potential to bring it into a desired potential value. Thus, normal operations of the circuit element 102, and further of the digital circuit 100 are obtained.

Meanwhile, in the case where the invention provides a condition where the circuit element 102 comprises a transistor, and a corrected input signal is inputted to the gate of the transistor, the gate capacitor of the transistor and the capacitor for storing the potential difference are connected in series to each other. That is, the resultant capacitance which is obtained by the serial connection between the gate capacitor of the transistor and the capacitor for storing a potential difference is to be smaller as compared to the capacitance obtained by the single gate capacitor of the transistor. Therefore, the delayed operation of the transistor due to the gate capacitor can be prevented, leading to a high-speed operation. Further, malfunction of the transistor as one of the circuit elements such that it is turned ON whereas it should be turned OFF can be prevented, thus an increase in power consumption due to the leaking current can be prevented.

It is to be noted that, the initialization of the charge held in the capacitor and the storing operation of the potential difference that is to be corrected are desirably conducted again before the normal operation of the digital circuit is disturbed due to the leaking of the current held in each capacitor.

A switch used in the invention may be any switch such as an electrical switch or a mechanical switch. It may be anything as far as it can control a current. It may be a transistor, a diode or a logic circuit configured with them. Therefore, in the case of employing a transistor as a switch, a polarity thereof (conductivity) is not particularly limited because it operates just as a switch. However, when OFF current is preferred to be small, a transistor of a polarity with small OFF current is favorably used. For example, the transistor which provides an LDD region has small OFF current. Further, it is desirable that an n-channel transistor is employed when a potential of the source terminal of the transistor as a switch is closer to the power supply potential on the low potential side (VSS), and a p-channel transistor is employed when the potential of the source terminal is closer to the power supply potential on the high potential side (VDD). This helps the switch operate efficiently as the absolute value of the voltage between the gate and drain of the transistor can be increased. It is also to be noted that, a CMOS switch can be employed as well by using both n-channel and p-channel transistors.

Further, the place of the switch is not particularly limited to the one shown in FIGS. 1B and 1C, and it can be decided by a designer at discretion as long as the circuit can implement the operation described above. The number of switches may also be increased or decreased when necessary.

Note that, in this specification, connection means an electrical connection unless otherwise stated. Therefore, in the configurations disclosed in the invention, elements which enable the electrical connections (other elements or switches or the like) may be additionally interposed among the predetermined connections.

DESCRIPTION OF THE PREFERRED EMBODIMENTS

Preferred embodiments of the invention will be hereinafter described referring to the accompanying drawings.

Embodiment Mode 1

In this embodiment mode, the specific configuration and operation of an inverter as an example of the digital circuits of the invention are described.

Figure 2:
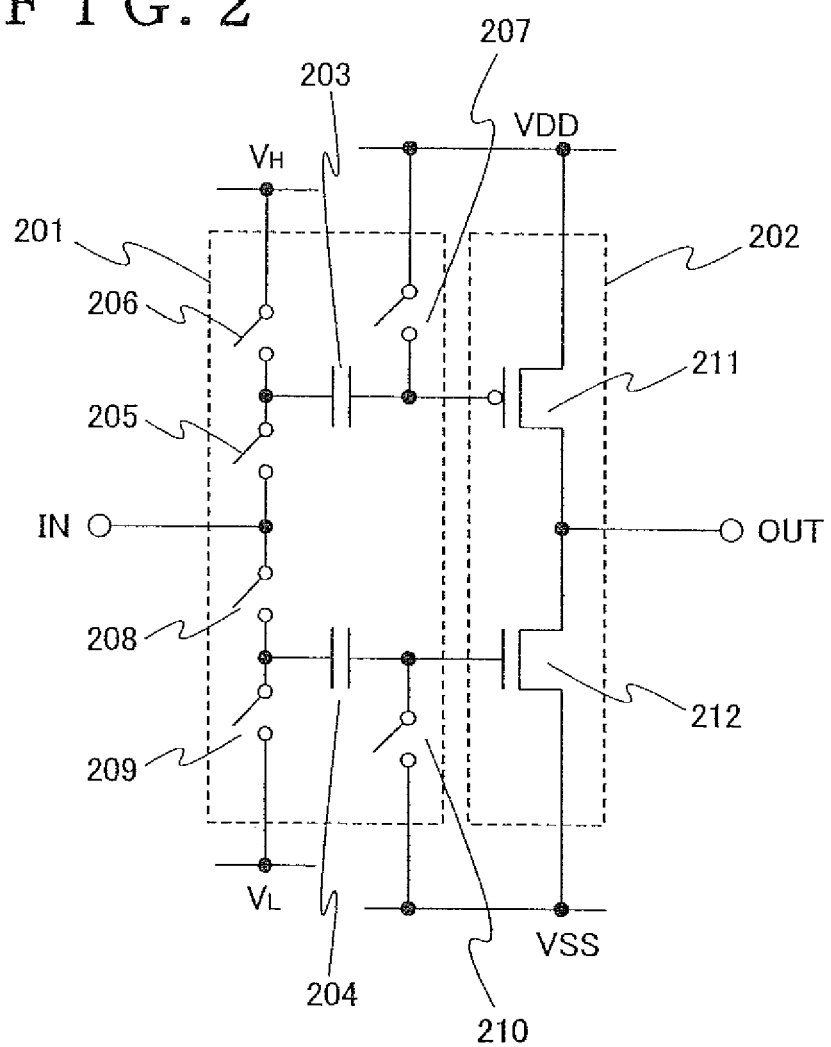
FIG. 2 is a first configuration diagram of an inverter as one of the digital circuits of the invention.

FIG. 2 shows the configuration of an inverter of this embodiment mode. Reference numeral 201 denotes a correcting unit and 202 denotes a circuit element group.

The correcting unit 201 comprises a first capacitor 203, a second capacitor 204, switches 205 to 207 for controlling the supply of a potential to the first capacitor 203, and switches 208 to 210 for controlling the supply of a potential to the second capacitor 204.

The switch 205 controls the supply of a potential of an input signal to the first electrode of the first capacitor 203. The switch 206 controls the supply of a power supply potential $V_H$ on the high potential side to the first electrode of the first capacitor 203. The switch 207 controls the supply of a power supply potential VDD to the second electrode of the capacitor 203.

Meanwhile, the switch 208 controls the supply of a potential of an input signal to the first electrode of the second capacitor 204. The switch 209 controls the supply of a power supply potential $V_L$, on the low potential side to the first electrode of the second capacitor 204. The switch 210 controls the supply of a power supply potential VSS to the second electrode of the second capacitor 204.

Although a power supply potential VDD is supplied to the second electrode of the first capacitor 203 by the switch 207 in this embodiment mode, the invention is not limited to this. Alternate potentials may be supplied to the second electrode of the first capacitor 203 in place of VDD, and the potential to be supplied may be adjusted in accordance with a potential of an input signal when necessary. Similarly, a power supply potential VSS is supplied to the second electrode of the second capacitor 204 by the switch 210 in this embodiment mode, however, the invention is not limited to this. Alternate potentials may be supplied to the second electrode of the second capacitor 204 in place of VSS, and the potential to be supplied may be adjusted in accordance with a potential of an input signal when necessary.

The circuit element group 202 comprises one p-channel transistor 211 and one n-channel transistor 212. The power supply potential VDD is supplied to the first terminal (the source here) of the p-channel transistor 211, and the power supply potential VSS is supplied to the first terminal (the source here) of the n-channel TFT 212. Meanwhile, the second terminal (the drain here) of the p-channel transistor 211 and the second terminal (the drain here) of the n-channel transistor 212 are connected to each other so that a potential of the second terminals of these two transistors are supplied to a subsequent circuit as a potential of the output signal OUT.

The second electrode of the first capacitor 203 is connected to the gate of the p-channel transistor 211, and the second electrode of the second capacitor 204 is connected to the gate of the n-channel transistor 212.

It is to be noted that, VDD is higher than VSS (VDD>VSS) and $V_H$ is higher than $V_L$ ($V_H$>$V_L$). Also, VDD is higher than $V_H$ (VDD>$V_H$) and $V_L$ is higher than VSS ($V_L$>VSS). It is desirable that the power supply potential $V_H$ is set closer to, or more preferably, equal or lower than a potential on the high potential side of the input signal IN of normal operations. By setting like this, the p-channel transistor 211 is easily turned OFF when a potential on the high potential side of the input signal IN is supplied thereto. Also, it is desirable that the power supply potential $V_L$ is set closer to, or more preferably, equal or higher than a potential on the low potential side of the input signal IN of normal operations. By setting like this, the n-channel transistor 212 is easily turned OFF when a potential on the low potential side of the input signal is supplied thereto. In this embodiment mode, it is assumed that the potential on the high potential side of the input signal is equal to the power supply potential $V_H$, and the potential on the low potential side of the input signal is equal to the power supply potential $V_L$. Also, $V_H-V_L>V_{THn}$ and $V_L-V_H<V_{THp}$ are to be satisfied.

In this embodiment mode, an explanation is given on the operation of the inverter on the assumption that each threshold voltage of the p-channel transistor 211 and of the n-channel transistor 212 in the circuit element group 202 is 0, however, the threshold voltage is not always 0 in an actual circuit. In this case, when the threshold voltage of the p-channel transistor 211 is referred to as $V_{THp}$ for example, it is desirable that $V_H$ is set to be higher than a potential on the high potential side of the input signal of normal operations by $|V_{THp}|$. Also, when the threshold voltage of the n-channel transistor 212 is referred to as $V_{THn}$ for example, it is desirable that $V_L$ is set to be lower than a potential on the low potential side of the input signal of normal operations by $|V_{THn}|$. By setting like this, normally-on is prevented and $|V_{GS}|$ can be raised to the maximum when the p-channel transistor 211 and the n-channel transistor 212 are to be turned ON, thus larger on-current is obtained.

Next, the operations of the inverter shown in FIG. 2 are described with reference to FIGS. 3A to 3B. It is to be noted that, the operations of the digital circuit of the invention are classified into an operation to store a potential difference to be corrected, and a normal operation as a primary function of the digital circuit.

First, the operation to store a potential difference is described with reference to FIG. 3. A potential difference to be corrected is different in the first capacitor 203 and in the second capacitor 204. The capacitor 203 stores the potential difference between the power supply potential VDD and the power supply potential $V_H$ on the high potential side, and the second capacitor 204 stores the potential difference between the power supply potential VSS and power supply the potential $V_L$ on the low potential side.

Figure 3A:
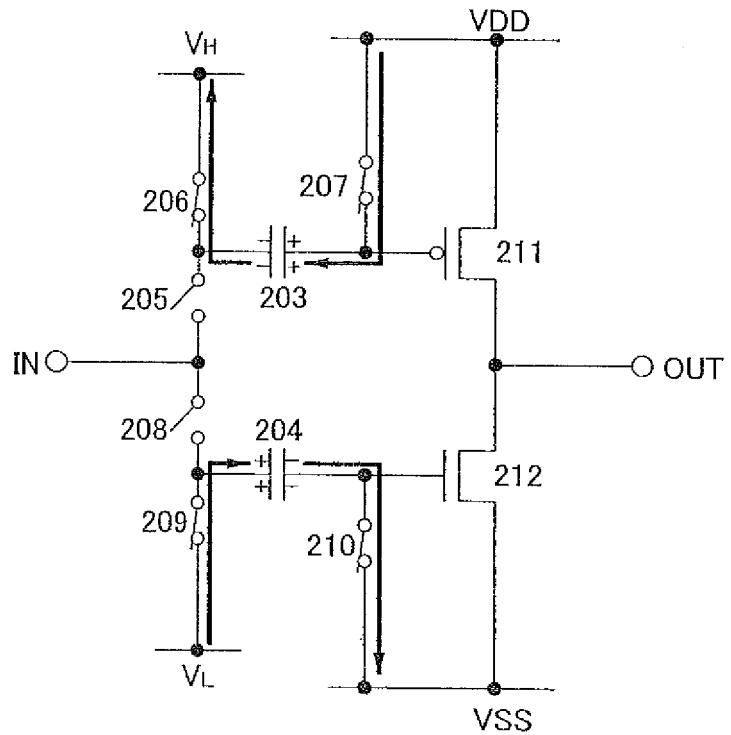
FIGS. 3A and 3B are diagrams showing the operations of the inverter shown in FIG. 2.

Specifically, by turning OFF the switch 205 and turning ON the switches 206 and 207 as shown in FIG. 3A, the power supply potential $V_H$ is supplied to the first electrode of the first capacitor 203, and the power supply potential VDD is supplied to the second electrode thereof. Therefore, charge is accumulated in the first capacitor 203 due to the power supply potential $V_H$ and the power supply potential VDD.

Meanwhile, by turning OFF the switch 208 and turning ON the switches 209 and 210, the power supply potential $V_L$ is supplied to the first electrode of the second capacitor 204 and the power supply potential VSS is supplied to the second electrode thereof.

Therefore, charge is accumulated in the second capacitor 204 due to the power supply potential $V_L$ and the power supply potential VSS.

Figure 3B:
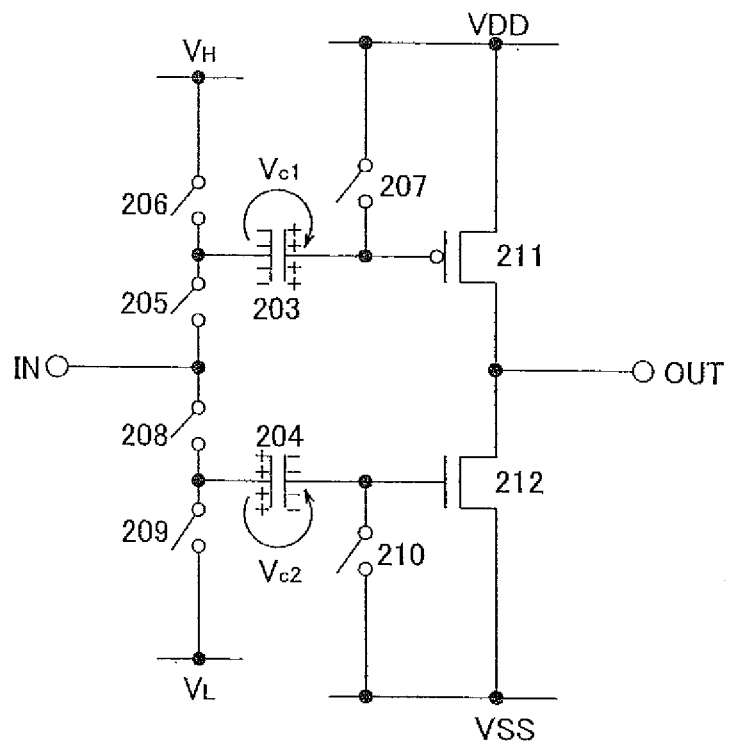

Next, by turning OFF the switches 205, 206 and 207 as shown in FIG. 3B, the accumulated charge is held in the first capacitor 203, thus the potential difference between the power supply potential VDD and the power supply potential $V_H$ (referred to as $V_{C1}$ is stored therein. Similarly, by turning OFF the switches 208, 209 and 210, the accumulated charge is held in the second capacitor 204, thus the potential difference between the power supply potential VSS and the power supply potential $V_L$ (referred to as $V_{C2}$) is stored therein.

Next, an explanation is given on the correction of a potential of an input signal by the stored potential difference, and a normal operation which is performed based on the corrected potential.

Figure 4A:
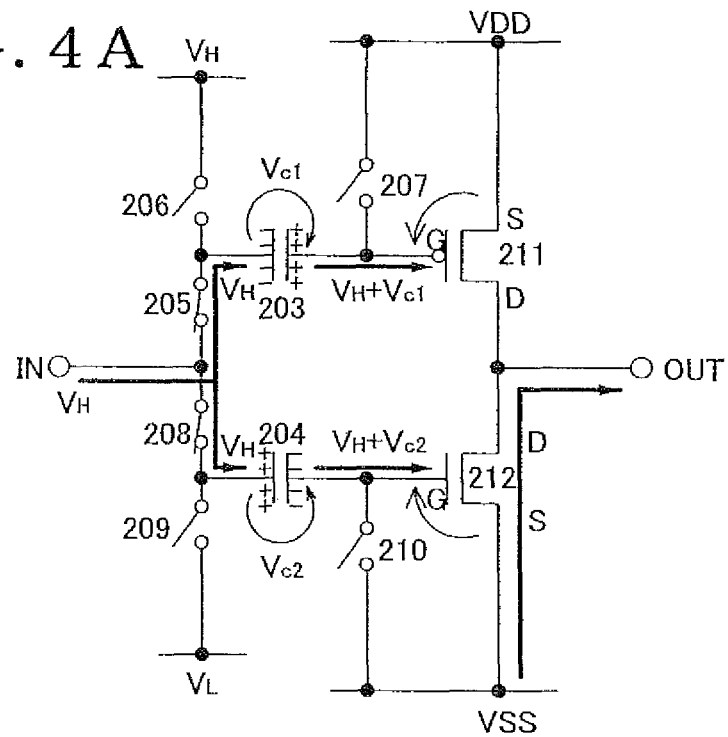
FIGS. 4A and 4B are diagrams showing the operations of the inverter shown in FIG. 2.

Described below is the operation when a potential of the input signal IN is on the high potential side ($V_H$ in this embodiment mode) with reference to FIG. 4A.

In the normal operation, the switches 206, 207, 209 and 210 are OFF at all times and the switches 205 and 208 are ON at all times. The potential $V_H$ of the input signal is supplied to the first electrode of the first capacitor 203 via the switch 205 and to the first electrode of the second capacitor 204 via the switch 208.

Each of the potential difference between the two electrodes of the first capacitor 203 and the potential difference between the two electrodes of the second capacitor 204 has a fixed value at all times following the law of conservation of electric charge. Thus, the potential of the second electrode of the first capacitor 203 is kept at a potential in which the potential difference $Vc_1$ is added to the potential $V_H$ when the potential $V_H$ is supplied to the first electrode thereof. The potential difference at this time is $Vc_1$=VDD$-V_H$, which means the potential of the second electrode of the first capacitor, 203 is VDD. Therefore, the potential VDD of the second electrode is supplied to the gate of the p-channel transistor 211, thus the gate voltage of the p-channel transistor 211 becomes 0 and it is turned OFF.

On the other hand, the potential of the second electrode of the second capacitor 204 is kept at a potential in which the potential difference $Vc_2$ is added to the potential $V_H$ when the potential $V_H$ is supplied to the first electrode thereof. The potential difference at this time is $Vc_2$=VSS$-V_L$, which means the potential of the second electrode of the second capacitor 204 is $V_H$+VSS$-V_L$. Therefore, the gate voltage of the n-channel transistor 212 becomes $V_H-V_L$ and it is turned ON when $V_H-V_L>V_{THn}$.

Therefore, when a potential of the input signal IN is $V_H$, the power supply potential VSS is supplied to the subsequent circuit as a potential of the output signal OUT.

Figure 4B:
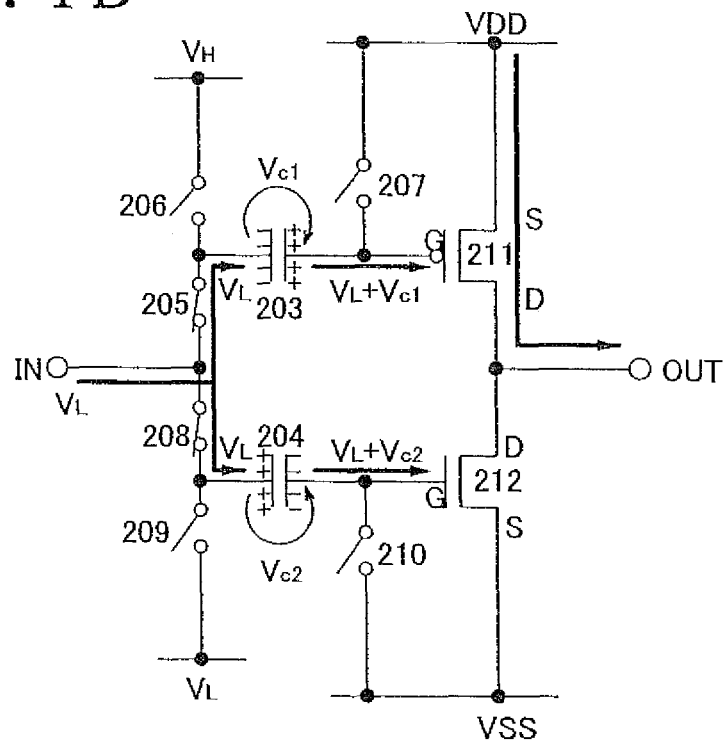

Next, the operation when a potential of the input signal IN is on the low potential side ($V_L$ in this embodiment mode) is described below with reference to FIG. 4B.

As described above, in the normal operation, the switches 206, 207, 209 and 210 are OFF at all times and the switches 205 and 208 are ON at all times. The potential of the input signal $V_L$ is supplied to the first electrode of the first capacitor 203 via the switch 205 and to the first electrode of the second capacitor 204 via the switch 208.

Each of the potential difference between the two electrodes of the first capacitor 203 and the potential difference between the two electrodes of the second capacitor 204 has a fixed value at all times following the law of conservation of electric charge. Therefore, the potential of the second electrode of the first capacitor 203 is kept at a potential in which the potential difference $Vc_1$ is added to the potential $V_L$ when the potential $V_L$ is supplied to the first electrode thereof. The potential difference at this time is $Vc_1$=VDD$-V_H$, which means the potential of the second electrode of the first capacitor 203 is $V_L$+VDD$-V_H$. Therefore, the gate voltage of the p-channel transistor 211 becomes $V_L-V_H$ and it is turned ON when $V_L-V_H<V_{THp}$.

On the other hand, the potential of the second electrode of the second capacitor 204 is kept at a potential in which the potential difference $Vc_2$ is added to the potential $V_L$ when the potential $V_L$ is supplied to the first electrode thereof. The potential difference at this time is $Vc_2$=VSS$-V_L$, which means the potential of the second electrode of the second capacitor 204 is VSS. The potential of the second electrode VSS is supplied to the gate of the n-channel transistor 212, thus the gate voltage of the n-channel transistor 212 becomes 0 and it is turned OFF.

Therefore, when the potential of the input signal IN is $V_L$, the power supply potential VDD is supplied to the subsequent circuit as a potential of an output signal OUT. According to the above configuration of the invention, the potential differences $V_{C1}$ and $V_{C2}$ are simultaneously obtained regardless of a potential of the input signal IN.

It is to be noted that, in this embodiment mode, the supply of the power supply potential VSS or VDD to the second electrode of each capacitor is controlled by the switch 207 or 210, however, the invention is not exclusively limited to this configuration. The supply of a power supply potential $V_H'$, which is different from the power supply potential VDD, to the second electrode of the first capacitor 203 may be controlled by the switch 207 as well. Also, the supply of a power supply potential $V_L'$, which is different from the power supply potential VSS, to the second electrode of the second capacitor 204 may be controlled by the switch 210. In this case, when the potential on the high potential side of the input signal IN is referred to as $V_H''$ and the potential on the low potential side thereof is referred to as $V_L''$, it is to be satisfied that $V_H''+V_L'-VSS>V_{THn}$ and $V_L''+V_H'-V_H-VDD<V_{THp}$. Furthermore, it is desirable that $V_{L'}-V_L-VSS\ V_{THn}$ and $V_H''-V_H-VDD\ V_{THp}$.

It is to be noted that, the number of wirings for supplying the power supply potential can be suppressed when the supply of the power supply potential VSS or VDD to the second electrode of each capacitor is controlled by the switch 207 or 210 as compared to the case of supplying the potential $V_{L'}$ or $V_{H'}$ each of which is different from the power supply potential VSS or VDD.

Embodiment Mode 2

In this embodiment mode, the configuration of an inverter as an example of the digital circuits of the invention is described, which is different from the configuration shown in Embodiment Mode 1.

Figure 5:
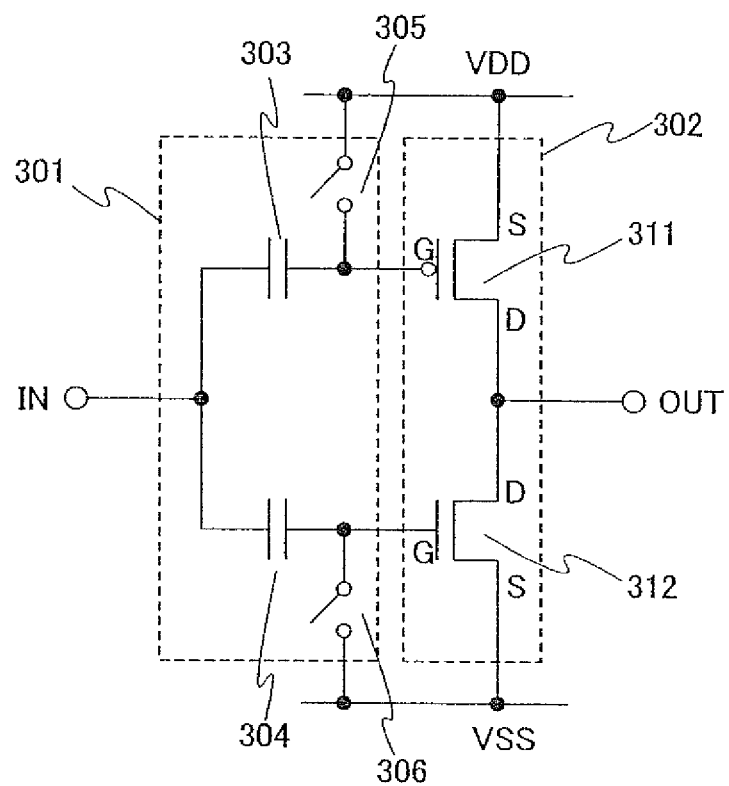
FIG. 5 is a second configuration diagram of an inverter as one of the digital circuits of the invention.

FIG. 5 shows the configuration of the inverter of this embodiment mode. Reference numeral 301 denotes a correcting unit and 302 denotes a circuit element group. The correcting unit 301 comprises a first capacitor 303, a second capacitor 304, a switch 305 for controlling the supply of a power supply potential VDD to the first capacitor 303, and a switch 306 for controlling the supply of a power supply potential VSS to the second capacitor 304.

Although the power supply potential VDD is supplied to the second electrode of the first capacitor 303 by the switch 305 in this embodiment mode, the invention is not limited to this. Alternate potentials may be supplied to the second electrode of the first capacitor 203 in place of VDD, and the potential to be supplied may be adjusted in accordance with a potential of an input signal when necessary. Similarly, the power supply potential VSS is supplied to a second electrode of the second capacitor 304 by the switch 306 in this embodiment mode, however, the invention is not limited to this. Alternate potentials may be supplied to the second electrode of the second capacitor 304 in place of VSS, and the potential to be supplied may be adjusted in accordance with a potential of an input signal when necessary.

The circuit element group 302 comprises one p-channel transistor 311 and one n-channel transistor 312. The power supply potential VDD is supplied to the first terminal (the source here) of the p-channel transistor 311, and the power supply potential VSS is supplied to a first terminal (the source here) of the n-channel TFT 312. Meanwhile, the second terminal (the drain here) of the p-channel transistor 311 and the second terminal (the drain here) of the n-channel transistor 312 are connected to each other so that a potential of the second terminals of these two transistors are supplied to a subsequent circuit as a potential of the output signal OUT.

Note that, VDD>VSS. Also, in the case where VSS is connected to the n-channel transistor 312 and the switch 306, and when the potential on the high potential side of the input signal is referred to as $V_H$ and the potential on the low potential side thereof is referred to as $V_L$, it is to be satisfied that $V_H-V_L>V_{THn}$ and $V_L-V_H<V_{THp}$.

Meanwhile, the second electrode of the first capacitor 303 is connected to the gate of the p-channel transistor 311, and the second electrode of the second capacitor 304 is connected to the gate of the n-channel transistor 312.

Figure 6A:
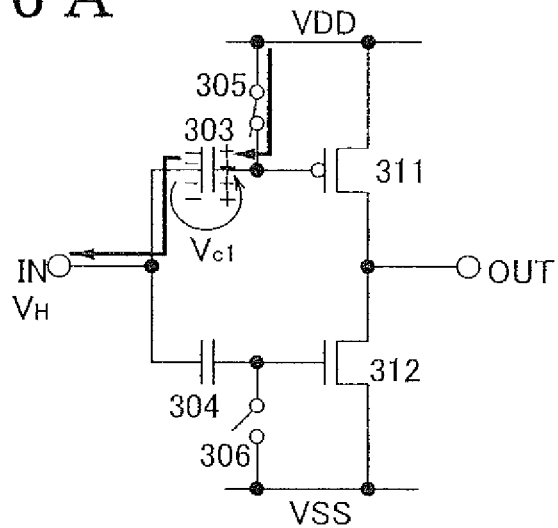
FIGS. 6A to 6C are diagrams showing the operations of the inverter shown in FIG. 5.
Figure 6B:
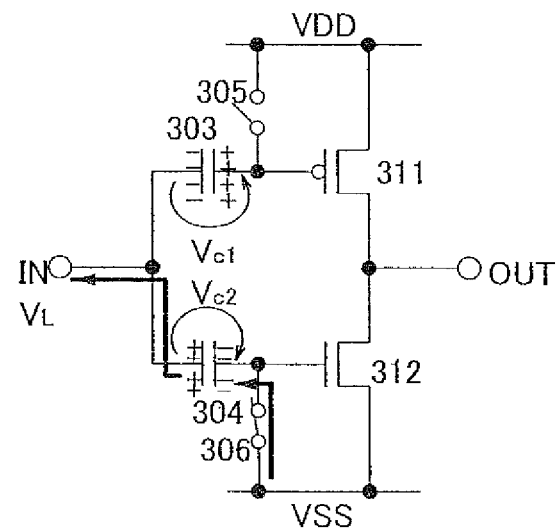
Figure 6C:
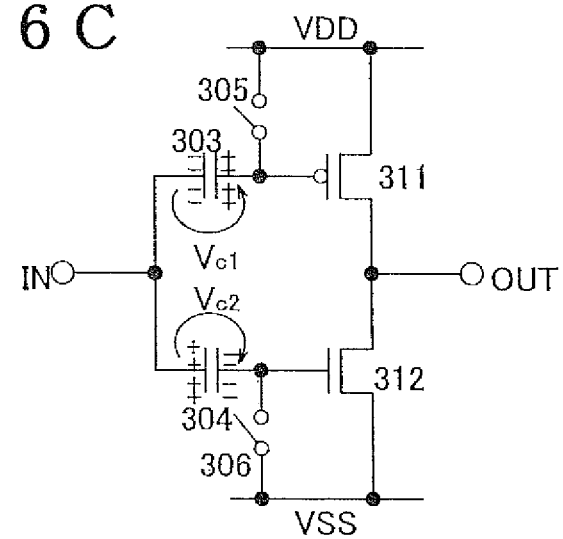

First, the operations of the inverter shown in FIG. 5 are described with reference to FIGS. 6A, 6B and 6C. The operations of the inverter shown in FIGS. 6A, 6B and 6C are also classified into an operation to store a potential difference to be corrected, and a normal operation as a primary function of the digital circuit. However, in the inverter of this embodiment mode, the supply of the power supply potential to each of the first capacitor and to the second capacitor is conducted not simultaneously, but in sequence.

First, the operation to store a potential difference into the first capacitor 303 is described with reference to FIG. 6A. By turning ON the switch 305 and turning OFF the switch 306 as shown in FIG. 6A, the power supply potential $V_H$ on the high potential side of the input signal IN is supplied to the first electrode of the first capacitor 303. Therefore, charge is accumulated in the first capacitor 303 due to the power supply potential $V_H$ of an input signal. IN and the power supply potential VDD. Subsequently, by turning OFF the switch 305, the accumulated charge is held in the first capacitor 303, thus the potential difference between the power supply potential VDD and the power supply potential $V_H$ on the high potential side of the input signal (referred to as $V_{C1}$) is stored therein.

Next, the operation to store a potential difference into the second capacitor 304 is described with reference to FIG. 6B. By turning OFF the switch 305 and turning ON the switch 306 as shown in FIG. 6B, the potential $V_L$ on the low potential side of the input signal IN is supplied to the first electrode of the second capacitor 304. Therefore, charge is accumulated in the second capacitor 304 due to the potential $V_L$ of the input signal IN and the power supply potential VSS. Subsequently, by turning OFF the switch 306, the accumulated charge is held in the second capacitor 304, thus the potential difference between the power supply potential VSS and the potential $V_L$ on the low potential side of the input signal (referred to as $V_{C2}$) is stored therein.

It is to be noted that, either of the charge accumulation into the first capacitor 303 or into the second capacitor 304 may be preceded.

Next, an explanation is given on the correction of a potential of an input signal by the stored potential difference, and a normal operation which is performed based on the corrected potential. As shown in FIG. 6C, the switches 305 and 306 are turned OFF at all times during the normal operation.

Each of the potential difference between the two electrodes of the first capacitor 303 and the potential difference between the two electrodes of the second capacitor 304 has a fixed value at all times following the law of conservation of electric charge. Thus, the potential of the second electrode of the first capacitor 303 is kept at a potential in which the potential difference $Vc_1$ is added to the potential $V_H$ when the potential $V_H$ is supplied to the first electrode thereof. The potential difference at this time is $Vc_1=VDD-V_H$, which means the potential of the second electrode of the first capacitor 303 is VDD. Therefore, the potential VDD of the second electrode is supplied to the gate of the p-channel transistor 311, thus the gate voltage of the p-channel transistor 311 becomes 0 and it is turned OFF.

On the other hand, the potential of the second electrode of the second capacitor 304 is kept at a potential in which the potential difference $Vc_2$ is added to the potential $V_H$ when the potential $V_H$ is supplied to the first electrode thereof. The potential difference at this time is $Vc_2=VSS-V_L$, which means the potential of the second electrode of the second capacitor 304 is $V_H+VSS-V_L$. Therefore, the gate voltage of the n-channel transistor 312 becomes $V_H-V_L$ and it is turned ON when $V_H-V_L > V_{THn}$.

Therefore, when the potential of the input signal IN is $V_H$, the power supply potential VSS is supplied to the subsequent circuit as a potential of the output signal OUT.

When the potential of the input signal IN is $V_L$, the potential $V_L$ of the input signal is supplied to the first electrode of the first capacitor 303 and to the first electrode of the second capacitor 304

Each of the potential difference between the two electrodes of the first capacitor 303 and the potential difference between the two electrodes of the second capacitor 304 has a fixed value at all times following the law of conservation of electric charge. Thus, the potential of the second electrode of the first capacitor 303 is kept at a potential in which the potential difference $Vc_1$ is added to the potential $V_L$, when the potential $V_L$ is supplied to the first electrode thereof. The potential difference at this time is $Vc_1=VDD-V_H$, which means the potential of the second electrode of the first capacitor 303 is $V_L+VDD-V_H$. Therefore, the gate voltage of the p-channel transistor 311 becomes 0 and it is turned OFF.

On the other hand, the potential of the second electrode of the second capacitor 304 is kept at a potential in which the potential difference $Vc_2$ is added to the potential $V_L$ when the potential $V_L$ is supplied to the first electrode thereof. The potential difference at this time is $Vc_2=VSS-V_L$, which means the potential of the second electrode of the second capacitor 304 is VSS. Therefore, the potential VSS of the second electrode is supplied to the gate of the n-channel transistor 312, thus the gate voltage of the n-channel transistor 312 becomes 0 and it is turned OFF.

Therefore, when the potential of the input signal IN is $V_L$, the power supply potential VDD is supplied to the subsequent circuit as a potential of an output signal.

According to the above configuration of the invention, a digital circuit can be operated normally regardless of a potential of an input signal. Furthermore, the number of switches disposed in the correcting unit can be reduced as compared to the digital circuit shown in FIG. 2, thus advantageous effects of the invention can be obtained with a simplified configuration.

It is to be noted that, in this embodiment mode, the supply of the power supply potential VSS or VDD to the second electrode of each capacitor 303 and 304 is controlled by the switches 305 and 306 respectively, however, the invention is not exclusively limited to this configuration. The supply of a power supply potential $V_{H'}$, which is different from the power supply potential VDD, to the second electrode of the first capacitor 303 may be controlled by the switch 305 as well. Also, the supply of a power supply potential $V_{L'}$, which is different from the power supply potential VSS, to the second electrode of the second capacitor 304 may be controlled by the switch 306. In this case, it is to be satisfied that $V_H+V_{L'}-V_L-VSS>V_{THn}$ and $V_L+V_{H'}-V_H-VDD<V_{THp}$. Furthermore, it is desirable that $V_{L'}-VSS V_{THn}$ and $V_{H'}-VDD V_{THp}$.

It is also to be noted that, the number of wirings for supplying the power supply potential can be suppressed when the supply of the power supply potential VSS or VDD to the second electrode of each capacitor is controlled by the switch 305 or 306 as compared to the case of supplying the potential $V_{L'}$ or $V_{H'}$, each of which is different from the power supply potential VSS or VDD.

Conversely, when supplying the potential $V_{L'}$ or $V_{H'}$, each of which is different from the power supply potential VSS or VDD, a potential difference which is to be stored in each capacitor can be set at discretion based on threshold voltages of the p-channel transistor 311 and of the n-channel transistor 312, unlike the case of controlling the supply of the power supply potential VSS or VDD to the second electrode of each capacitor by the switch 305 or 306. In this embodiment mode, an explanation is given on the operation of the inverter on the assumption that each threshold voltage of the p-channel transistor 311 and of the n-channel transistor 312 in the circuit element group 302 is 0, however, the threshold voltage is not always 0 in an actual circuit. In this case, when the threshold voltage of the p-channel transistor 311 is referred to as $V_{THp}$ for example, it is desirable that $V_{H'}$ is set to be higher than a potential $V_H$ on the high potential side of the input signal of normal operations by $|V_H|$. Also, when the threshold voltage of the n-channel transistor 312 is referred to as $V_{THn}$ for example, it is desirable that $V_L$ is set to be lower than a potential $V_L$ on the low potential side of the input signal of normal operations by $|V_{THn}|$. By setting like this, a potential of an input signal can be corrected based on a threshold voltage of each transistor, and more accurate operations of the digital circuit is thus obtained.

Embodiment Mode 3

In this embodiment mode, the configuration of an NAND as an example of the digital circuits of the invention is described.

Figure 7:
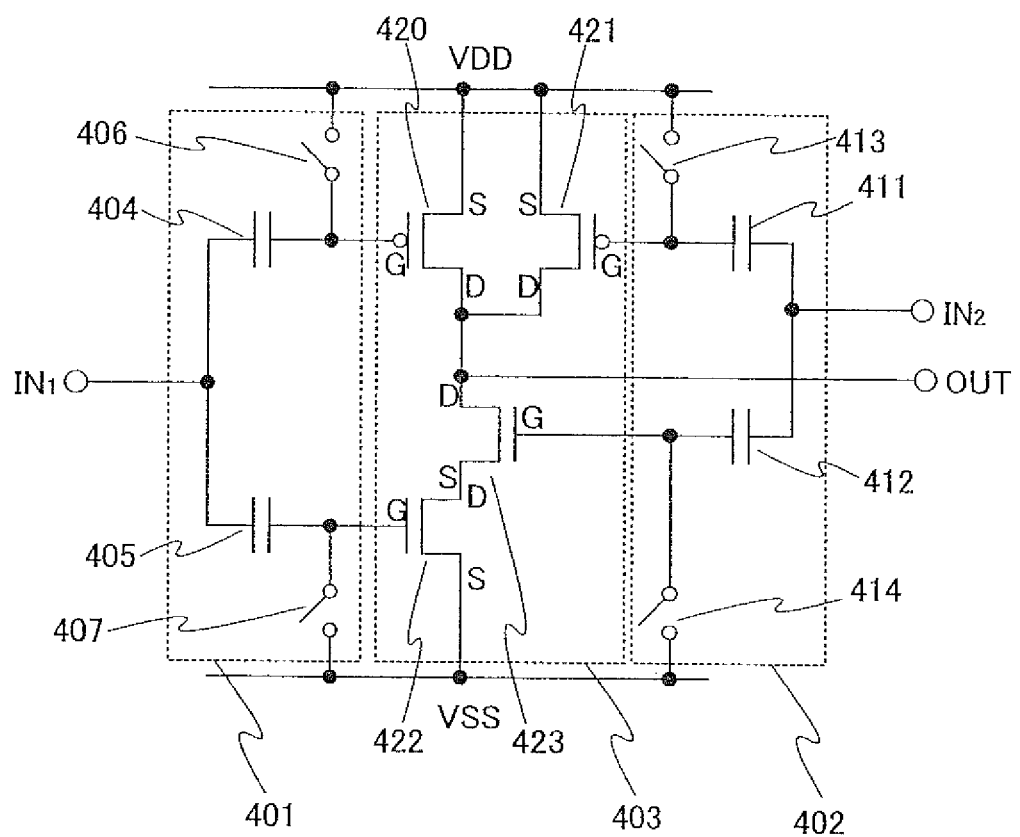
FIG. 7 is a second configuration diagram of a NAND which is one of the digital circuits of the invention.

The NAND in this embodiment mode which is shown in FIG. 7 comprises a first correcting unit 401, a second correcting unit 402 and a circuit element group 403.

The first correcting unit 401 comprises a first capacitor 404, a second capacitor 405, a switch 406 for controlling the supply of a power supply potential VDD to the first capacitor 404, and a switch 407 for controlling the supply of a power supply potential VSS to the second capacitor 405.

The second correcting unit 402 comprises a third capacitor 411, a fourth capacitor 412, a switch 413 for controlling the supply of a power supply potential VDD to the third capacitor 411, and a switch 414 for controlling the supply of the power supply potential VSS to the fourth capacitor 412.

The circuit element group 403 comprises two p-channel transistors 420 and 421 and two n-channel transistors 422 and 423. The power supply potential VDD is supplied to the first terminal (the source here) of the p-channel transistor 420 and to the first terminal (the source here) of the p-channel transistor 421. The second terminal (the drain here) of the p-channel transistor 420 and the second terminal (the drain here) of the p-channel transistor 421 are connected to each other. Meanwhile, the power supply potential VSS is supplied to the first terminal (the source here) of then-channel transistor 422. The second terminal (the drain here) of the n-channel transistor 422 is connected to the first terminal (the source here) of the n-channel transistor 423. The second terminal (the drain here) of the n-channel transistor 423 is connected to the second terminals of the p-channel transistors 420 and 421. It is to be noted that, potentials at the second terminals of the n-channel transistor 423 and of the p-channel transistors 420 and 421 are supplied to a subsequent circuit as a potential of an output signal OUT.

The second electrode of the first capacitor 404 is connected to the gate of the p-channel transistor 420. The second electrode of the second capacitor 405 is connected to the gate of the n-channel transistor 422. The second electrode of the third capacitor 411 is connected to the gate of the p-channel transistor 421. The second electrode of the fourth capacitor 412 is connected to the gate of the n-channel transistor 423.

A potential of an input signal $IN_1$ is supplied to the first electrodes of the first capacitor 404 and of the second capacitor 405, and a potential of an input signal $IN_2$ is supplied to the first electrodes of the third capacitor 411 and of the fourth capacitor 412.

It is to be noted that, VDD is higher than VSS (VDD>VSS). Also, when a potential on the high potential side of an input signal is referred to as $V_H$, a potential on the low potential side of an input signal as $V_L$, a threshold voltage of each p-channel transistor 420 and 421 as $V_{THp}$ and a threshold voltage of each n-channel transistor 422 and 423 as $V_{THn}$, it is to be satisfied that $V_H - V_L > V_{THn}$, and $V_L < V_{THn}$.

The operations of the NAND which is shown in FIG. 7 are also classified into an operation to store a potential difference to be corrected, and a normal operation as a primary function of a digital circuit. However, in the NAND of this embodiment mode, the supply of the power supply potential to each of the first capacitor 404 and the second capacitor 405 is conducted not simultaneously, but in sequence. Likewise, the supply of the power supply potential to each of the third capacitor 411 and the fourth capacitor 412 is not conducted simultaneously, but in sequence.

When storing a potential difference into the first capacitor 404, the power supply potential $V_H$ on the high potential side of the input signal $IN_1$ is supplied to the first electrode of the first capacitor 404 by turning ON the switch 406 and turning OFF the switch 407. Once a sufficient charge is accumulated, it is held in the first capacitor 404 by turning OFF the switch 406. Meanwhile, when storing a potential difference into the second capacitor 405, the power supply potential $V_L$ on the low potential side of the input signal $IN_1$ is supplied to the first electrode of the second capacitor 405 by turning ON the switch 407 and turning OFF the switch 406. Once a sufficient charge is accumulated, it is held in the second capacitor 405 by turning OFF the switch 407.

When storing a potential difference into the third capacitor 411, the power supply potential $V_H$ on the high potential side of the input signal $IN_2$ is supplied to the first electrode of the third capacitor 411 by turning ON the switch 413 and turning OFF the switch 414. Once a sufficient charge is accumulated, it is held in the third capacitor 411 by turning OFF the switch 413. Meanwhile, when storing a potential difference into the fourth capacitor 412, the power supply potential $V_L$ on the low potential side of the input signal $IN_2$ is supplied to the first electrode of the fourth capacitor 412 by turning ON the switch 414 and turning OFF the switch 413. Once a sufficient charge is accumulated, it is held in the fourth capacitor 412 by turning OFF the switch 414.

Then, in the normal operation, a potential of an input signal is corrected based on the stored potential difference. In the normal operation, the switches 406, 407, 413 and 414 are turned OFF at all times.

According to the above configuration of the invention, a digital circuit can be operated normally regardless of a potential of an input signal.

It is to be noted that, in this embodiment mode, the supply of the power supply potential VSS or VDD to a second electrode of each capacitor is controlled by the switches 406, 407, 413 and 414. However, the invention is not limited to this configuration. The supply of a power supply potential $V_{H1'}$, which is different from the power supply potential VDD, to the second electrode of the first capacitor 404 may be controlled by the switch 406, and the supply of a power supply potential $V_{L1'}$, which is different from the power supply potential VSS, to the second electrode of the second capacitor 405 may be controlled by the switch 407. In this case, it is to be satisfied that $V_H + V_{L1'} - V_L - VSS > V_{THp}$ and $V_L + V_{H1'} - VDD < V_{THn}$. Furthermore, it is desirable that $V_{L1'} - VSS$ $V_{THn}$, and $V_{H1'} - VDD$ $V_{THp}$.

Meanwhile, the supply of a power supply potential $V_{H2'}$, which is different from the power supply potential VDD, to the second electrode of the third capacitor 411 may be controlled by the switch 413, and the supply of a power supply potential $V_{L2'}$, which is different from the power supply potential VSS, to the second electrode of the fourth capacitor 412 may be controlled by the switch 414. In this case, it is to be satisfied that $V_H + V_{L2'} - V_L - VSS > V_{THp}$ and $V_L + V_{H2'} - V_H - VDD < V_{THn}$. Furthermore, it is desirable that $V_{L2'} - VSS$ $V_{THn}$, and $V_{H2'} - VDD$ $V_{THp}$.

It is to be noted that, the number of wirings for supplying the power supply potential can be suppressed when the supply of the power supply potential VSS or VDD to the second electrode of each capacitor is controlled by the switches 406, 407, 413 and 414 as compared to the case of supplying a potential which is different from the power supply potential VSS or VDD.

Conversely, when supplying a potential which is different from the power supply potential VSS or VDD, a potential difference which is to be stored in each capacitor can be set at discretion according to a threshold voltage of each of transistors 420 to 423, unlike the case of controlling the supply of the power supply potential VSS or VDD to the second electrode of each capacitor by the switches 406, 407, 413 and 414. When a threshold voltage of each of p-channel transistors 420 and 421 is referred to as $V_{THp}$ for example, it is desirable that $V_{H1'}$ or $V_{H2'}$ is set to be lower than a potential $V_H$ on the low potential side of the input signal of normal operations by $|V_{THp}|$. Also, when a threshold voltage of each n-channel transistor 421 and 423 is referred to as $V_{THn}$ for example, it is desirable that $V_{L1'}$ or $V_{L2'}$ is set to be higher than a potential $V_H$ on the low potential side of the input signal of normal operations by $|V_{THn}|$. By setting like this, a potential of an input signal can be corrected according to the threshold voltage of each transistor, and more accurate operations of the digital circuit is thus obtained.

Figure 1A:
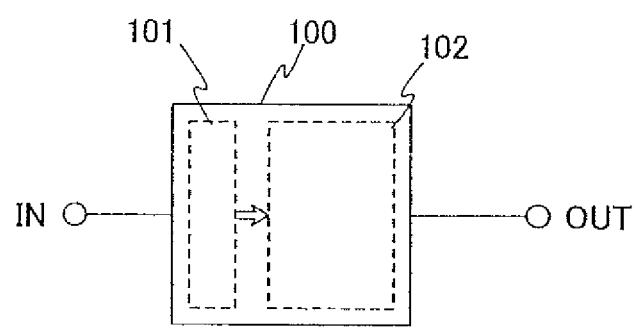
FIGS. 1A to 1C are configuration diagrams of a digital circuit of the invention.
Figure 1B:
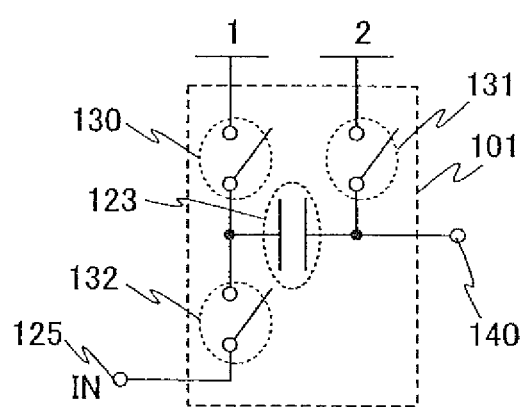
Figure 1C:
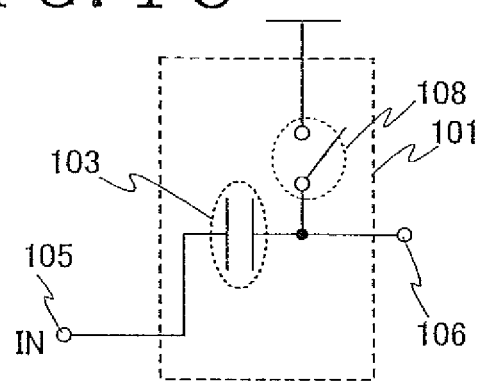

It is to be noted that, described in this embodiment mode is the case of employing the second configuration of the inverter shown in FIG. 1C just as shown in FIG. 5, however, it is also possible to employ the first configuration shown in FIG. 1B just as shown in FIG. 4.

It is also to be noted that, shown in this embodiment mode is an example in which the invention is applied to a NAND, however, it can be applied to various logic circuits such as NORs and transmission gates as well.

Embodiment Mode 4

In this embodiment mode, the specific configuration and operation of a clocked inverter as an example of the digital circuits of the invention are described.

Figure 8A:
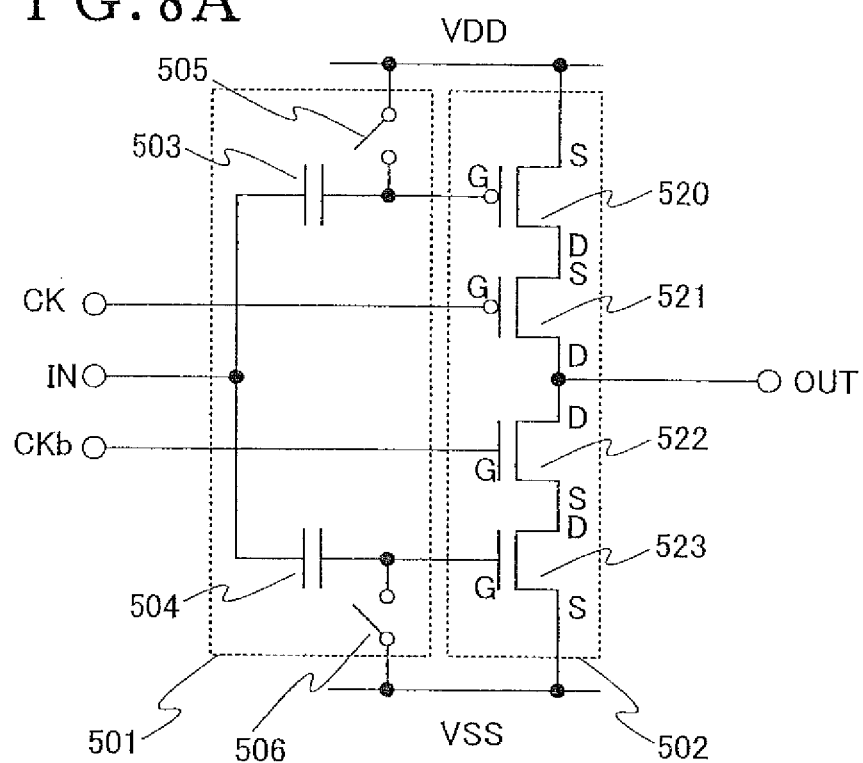
FIGS. 8A and 8B are second configuration diagrams of a clocked inverter as one of the digital circuits of the invention.

The clocked inverter of this embodiment mode which is shown in FIG. 8A comprises a correcting unit 501 and a circuit element group 502.

The correcting unit 501 comprises a first capacitor 503, a second capacitor 504, a switch 505 for controlling the supply of a power supply potential VDD to the first capacitor 503 and a switch 506 for controlling the supply of a power supply potential VSS to the second capacitor 504.

The circuit element group 502 comprises two p-channel transistors 520 and 521 and two n-channel transistors 522 and 523. The power supply potential VDD is supplied to the first terminal (the source here) of the p-channel transistor 520. The second terminal (the drain here) of the p-channel transistor 520 and the first terminal (the source here) of the p-channel transistor 521 are connected to each other. Meanwhile, the power supply potential VSS is supplied to the first terminal (the source here) of the n-channel transistor 523. The second terminal (the drain here) of the n-channel transistor 523 and the first terminal (the source here) of the n-channel transistor 522 are connected to each other.

Further, the second terminal (the drain here) of the n-channel transistor 522 is connected to the second terminal (the drain here) of the p-channel transistor 521, therefore, potentials at the second terminals of the n-channel transistor 522 and of the p-channel transistor 521 are supplied to a subsequent circuit as a potential of an output signal OUT.

The second electrode of the first capacitor 503 is connected to the gate of the p-channel transistor 520, and the second electrode of the second capacitor 504 is connected to the gate of the n-channel transistor 523.

A potential of an input signal IN is inputted to the first electrode of the first capacitor 503 and to the first electrode of the second capacitor 504. A clock signal CK is inputted to the gate of the p-channel transistor 521, and an inverted clock signal CKb which corresponds to a signal obtained by inverting a polarity of the clock signal is inputted to the gate of the n-channel transistor 522.

It is to be noted that, VDD is higher than VSS (VDD>VSS). When the potential on the high potential side of the input signal IN is referred to as $V_H$, the potential on the low potential side thereof as $V_L$, a threshold voltage of the p-channel transistor 520 as $V_{THp}$ and a threshold voltage of the n-channel transistor 523 as $V_{THn}$, it is to be satisfied that $V_H-V_L>V_{THn}$, and $V_L-V_H<V_{THp}$.

The operations of the clocked inverter shown in FIG. 8A are also classified into an operation to store a potential difference to be corrected and a normal operation as a primary function of the digital circuit as well as in Embodiment Modes 1 to 3. However, in the inverter of this embodiment mode, the supply of the power supply potential to each of the first element capacitor 503 and the second capacitor 504 is conducted not simultaneously, but in sequence.

When storing a potential difference into the first capacitor 503, the power supply potential $V_H$ on the high potential side of the input signal IN is supplied to the first electrode of the first capacitor 503 by turning ON the switch 505 and turning OFF the switch 506. Once a sufficient charge is accumulated, it is held in the first capacitor 503 by turning OFF the switch 505. Meanwhile, when storing a potential difference into the second capacitor 504, the power supply potential $V_L$ on the low potential side of the input signal IN is supplied to the first electrode of the second capacitor 504 by turning ON the switch 506 and turning OFF the switch 505. Once a sufficient charge is accumulated, it is held in the second capacitor 504 by turning OFF the switch 506.

Then, in the normal operation, a potential of an input signal is corrected based on the stored potential difference. In the normal operation, the switches 505 and 506 are turned OFF at all times.

According to the above configuration of the invention, a digital circuit can be operated normally regardless of a potential of an input signal.

It is to be noted that, the connection between the p-channel transistor 521 and the p-channel transistor 520 is not particularly limited to the configuration shown in FIG. 8A. For example, they may be connected in such a manner that the supply of the power supply potential VDD to the source of the p-channel transistor 520 is controlled by the p-channel transistor 521.

Similarly, the connection between the n-channel transistor 522 and the n-channel transistor 523 is not particularly limited to the configuration shown in FIG. 8A. For example, they may be connected in such a manner that the supply of the power supply potential VSS to the source of the n-channel transistor 523 is controlled by the n-channel transistor 522.

Next, a clocked inverter with a different configuration from that shown in FIG. 8A is described below. A clocked inverter of this embodiment mode which is shown in FIG. 8B is different from the clocked inverter shown in FIG. 8A with regard to the connection of the correction unit 501 and the circuit element group 502.

Specifically, a clock signal CK is inputted to the first electrode of the first capacitor 503, and an inverted clock signal CKb which corresponds to a signal obtained by inverting a polarity of the clock signal is inputted to the first electrode of the second capacitor 504. A potential of an input signal IN is inputted to the gates of the p-channel transistor 541 and of the n-channel transistor 542.

Figure 8B:
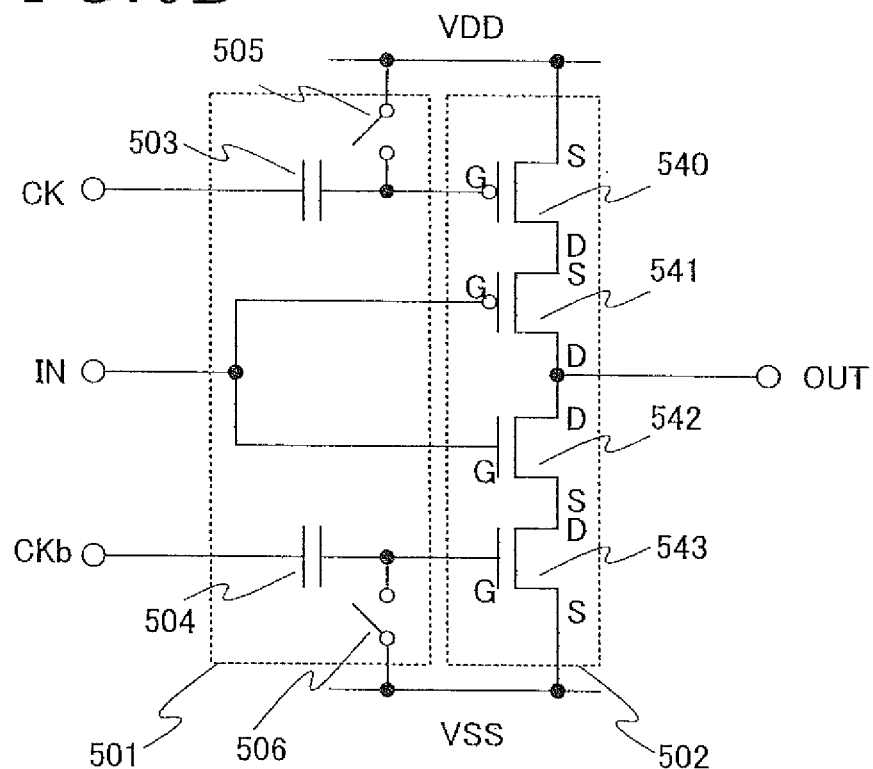

The operations of the clocked inverter shown in FIG. 8B are classified into an operation to store a potential difference to be corrected and a normal operation as a primary function of the digital circuit as well as the ones shown in FIG. 8A. However, in the inverter of this embodiment mode, the supply of the power supply potential to each capacitor is conducted not simultaneously, but in sequence.

When storing a potential difference into the first capacitor 503, the power supply potential $V_H$ on the high potential side of the clock signal CK is supplied to the first electrode of the first capacitor 503 by turning ON the switch 505 and turning OFF the switch 506. Once a sufficient charge is accumulated, it is held in the first capacitor 503 by turning OFF the switch 505. Meanwhile, when storing a potential difference into the second capacitor 504, the power supply potential $V_L$ on the low potential side of the inverted clock signal CKb is supplied to the first electrode of the second capacitor 504 by turning ON the switch 506 and turning OFF the switch 505. Once a sufficient charge is accumulated, it is held in the second capacitor 504 by turning OFF the switch 506.

Then, in the normal operation, a potential of an input signal is corrected based on the stored potential difference. In the normal operation, the switches 505 and 506 are turned OFF at all times.

According to the above configuration of the invention, a digital circuit can be operated normally regardless of a potential of an input signal It is to be noted that, in this embodiment mode, the supply of the power supply potential VSS or VDD to the second electrode of each of capacitors 505 and 506 is controlled by the switches 505 and 506 respectively, however, the invention is not exclusively limited to this configuration. The supply of a power supply potential $V_{H'}$, which is different from the power supply potential VDD, to the second electrode of the first capacitor 503 may be controlled by the switch 505 as well. Also, the supply of a power supply potential VC, which is different from the power supply potential VSS, to the second electrode of the second capacitor 504 may be controlled by the switch 506. In this case, it is to be satisfied that $V_H+V_L'-V_L-VSS>V_{THn}$ and $V_L+V_{H'}-V_H-VDD<V_{THp}$. Furthermore, it is desirable that $V_L-VSS\ V_{THn}$, and $V_{H'}-VDD\ V_{THp}$.

It is also to be noted that, the number of wirings for supplying the power supply potential can be suppressed when the supply of the power supply potential VSS or VDD to the second electrode of each capacitor is controlled by the switch 505 or 506 as compared to the case of supplying a potential which is different from the power supply potential VSS or VDD.

Conversely, when supplying a potential which is different from the power supply potential VSS or VDD, a potential difference which is to be stored in each capacitor can be set at discretion according to on the threshold voltage of each of transistors 540 and 543, unlike the case of controlling the supply of the power supply potential VSS or VDD to the second electrode of each capacitor by the switches 505 and 506. When a threshold voltage of the p-channel transistor 540 is referred to as $V_{THp}$ for example, it is desirable that $V_{H'}$ is set to be higher than a potential $V_H$ on the high potential side of the input signal of normal operations by $|V_{THp}|$. Also, when a threshold voltage of the n-channel transistor 543 is referred to as $V_{THn}$ for example, it is desirable that $V_{L'}$ is set to be higher than a potential on the low potential side $V_L$ of the input signal of normal operations by $|V_{THn}|$.

By setting like this, a potential of an input signal can be corrected based on the threshold voltage of each transistor, and more accurate operations of the digital circuit is thus obtained.

It is to be noted that, the clocked inverter in this embodiment may be configured with the combination of FIGS. 8A and 8B.

The transistor used for the digital circuit of the invention may be a single crystalline silicon transistor, an SOI transistor, or a thin film transistor utilizing a polycrystalline semiconductor, a semi-amorphous semiconductor or an amorphous semiconductor, or a transistor utilizing an organic semiconductor, a carbon nanotube, or the like. Furthermore, the type of substrate on which a transistor is mounted is not exclusively limited to a certain type. It may be a single crystalline substrate, an SOI substrate, or a glass substrate, and the like.

Described in this embodiment mode is the case of employing the second configuration of the inverter shown in FIG. 1C as was in FIG. 5, however, it is also possible to employ the first configuration shown in FIG. 1B as was in FIG. 4.

Embodiment Mode 5

Described in this embodiment mode, based on the inverter of the invention shown in FIG. 2, is a mode in which a potential other than the power supply potential VDD is supplied to the second electrode of the first capacitor 203, and a potential other than the power supply potential VSS is supplied to the second electrode of the second capacitor 204.

Figure 16A:
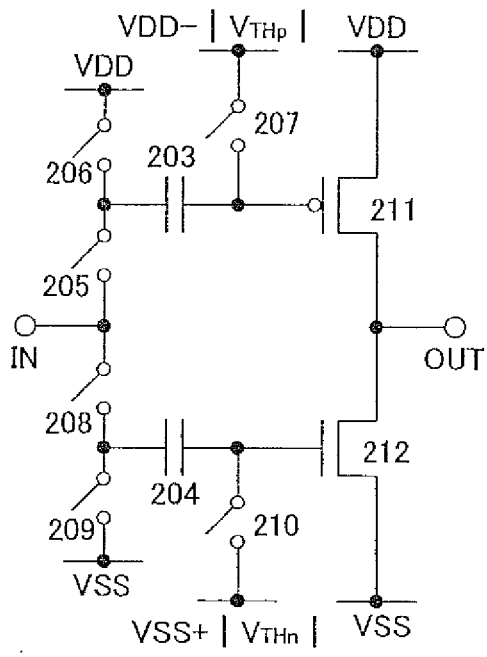
FIGS. 16A to 16D are diagrams showing the operations of an inverter of the invention.

Shown in FIG. 16A is the configuration of an inverter of this embodiment mode. The same reference numerals are given to the same components as those described in FIG. 2. In FIG. 16A, each power supply voltage is optimized so that a charge corresponding to the threshold voltage of the p-channel transistor 211 is accumulated in the first capacitor 203, and a charge corresponding to the threshold voltage of the n-channel transistor 212 is accumulated in the second capacitor 204. In this embodiment mode, a potential which is supplied to the first electrode of the first capacitor 203 by the switch 206 is VDD, and a potential which is supplied to the second electrode of the first capacitor 203 by the switch 207 is VDD−$|V_{THp}|$. Meanwhile, a potential which is supplied to the first electrode of the second capacitor 204 by the switch 209 is VSS, and a potential which is supplied to the second electrode of the second capacitor 204 by the switch 210 is VSS+$|V_{THn}|$.

The operation of the inverter shown in FIG. 16A is described below with reference to FIGS. 16B to 16D.

First, charges are stored in the first capacitor 203 and in the second capacitor 204. In this embodiment mode, the control of a potential at the second electrode of the first capacitor 203 and the control of a potential at the source of the p-channel transistor 211 can be carried out individually. Also, the control of a potential at the second electrode of the second capacitor 204 and the control of a potential at the source of the n-channel transistor 212 can be carried out individually. Therefore, charges can be accumulated in the first capacitor 203 and in the second capacitor 204 in parallel with each other.

Figure 16B:
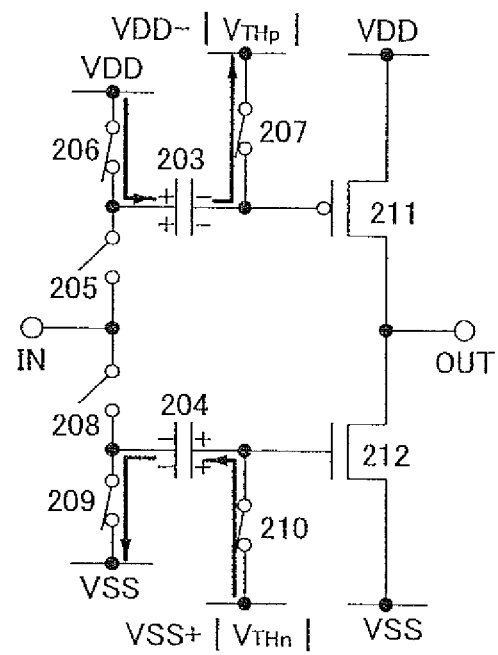
Figure 16C:
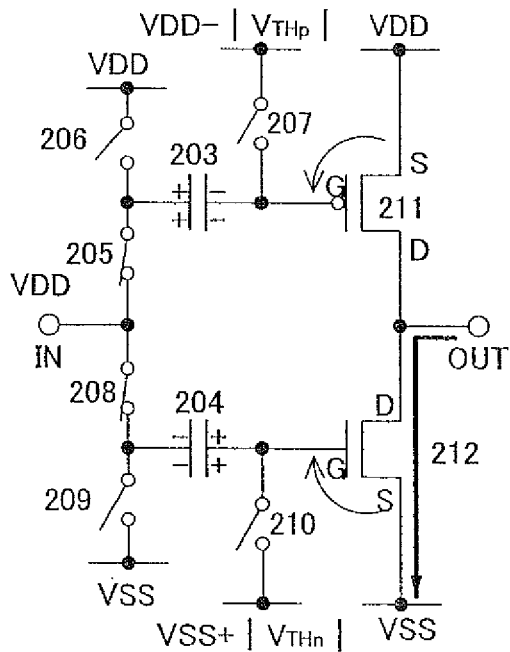

First, by turning ON the switches 206, 207, 209 and 210, and turning OFF the switches 205 and 208 as shown in FIG. 16B, the threshold voltage of the p-channel transistor 211 is stored in the first capacitor 203, and the threshold voltage of the n-channel transistor 212 is stored in the second capacitor 204. Subsequently, by turning OFF the switches 206, 207, 209 and 210, the accumulated charges are each held in the first capacitor 203 and in the second capacitor 204.

Next, an explanation is given on the correction of a potential of an input signal by the stored potential difference, and a normal operation which is performed based on the corrected potential.

Described below is the operation when a potential of an input signal IN is equal to the one of the power supply potential VDD with reference to FIG. 16C. In normal operations, the switches 206, 207, 209 and 210 are turned OFF and the switches 205 and 208 are turned ON at all times, and a potential of the input signal is supplied to the first electrode of the first capacitor 203 via the switch 205 and to the first electrode of the second capacitor 204 via the switch 208.

As the threshold voltage subtracted by $|V_{THp}|$ ($V_{THp}$−$|V_{THp}|$) is held in the first capacitor 203, a potential of the second electrode thereof is equal to VDD−$|V_{THp}|$. Therefore, a gate voltage of the p-channel transistor 211 becomes $V_{GSp}$=−$|V_{THp}|$, thus it is turned OFF.

Meanwhile, as the threshold voltage ($|V_{THn}|$) is held in the second capacitor 204, a potential of the second electrode thereof is equal to VDD+$|V_{THn}|$. Therefore, a gate voltage of the n-channel transistor 212 becomes $V_{GSn}$=VDD−VSS+$|V_{THn}|$>$|V_{THn}|$, thus it is turned ON.

Therefore, when the potential of the input signal IN is equal to VDD, the power supply potential VSS is supplied to a subsequent circuit as a potential of an output signal.

Figure 16D:
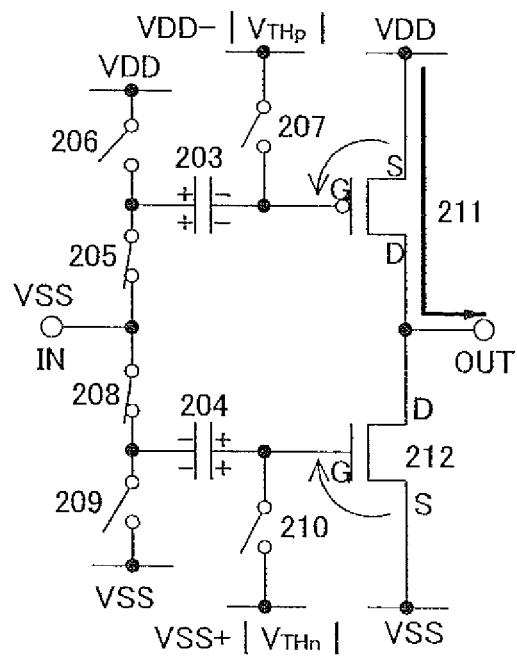

Described below with reference to FIG. 16D is the operation when a potential of the input signal IN is equal to a potential of the power supply potential VSS. In normal operations, the switches 206, 207, 209 and 210 are turned OFF and the switches 205 and 208 are turned ON as in the case shown in FIG. 16C. A potential of the input signal is supplied to the first electrode of the first capacitor 203 via the switch 205 and to the first electrode of the second capacitor 204 via the switch 208.

As the threshold voltage subtracted by $|V_{THp}|$ ($V_{THp}$−$|V_{THp}|$) is held in the first capacitor 203, a potential of the second electrode thereof is equal to VSS−$|V_{THp}|$. Therefore, a gate voltage of the p-channel transistor 211 becomes $V_{GSp}$=VSS−VDD−$|V_{THp}|$<−$|V_{THp}|$, thus it is turned ON.

Meanwhile, as the threshold voltage ($|V_{THn}|$) is held in the second capacitor 204, a potential of the second electrode thereof is equal to VSS+$|V_{THn}|$. Therefore, a gate voltage of the n-channel transistor 212 becomes $V_{GSn}$=$|V_{THn}|$, thus it is turned OFF.

Therefore, when the potential of the input signal IN is equal to VSS, the power supply potential VSS is supplied to a subsequent circuit as a potential of an output signal.

According to the present embodiment mode, the operation speed of transistors can be improved even when a power supply potential is not sufficiently large relatively to the threshold voltage of each transistor. Thus, the power consumption of the digital circuit is suppressed.

Embodiment Mode 6

Described in this embodiment mode, based on the inverter of the invention shown in FIG. 5, is a mode in which a potential other than the power supply potential VDD is supplied to the second electrode of the first capacitor 303, and a potential other than the power supply potential VSS is supplied to the second electrode of the capacitor 304.

Figure 17A:
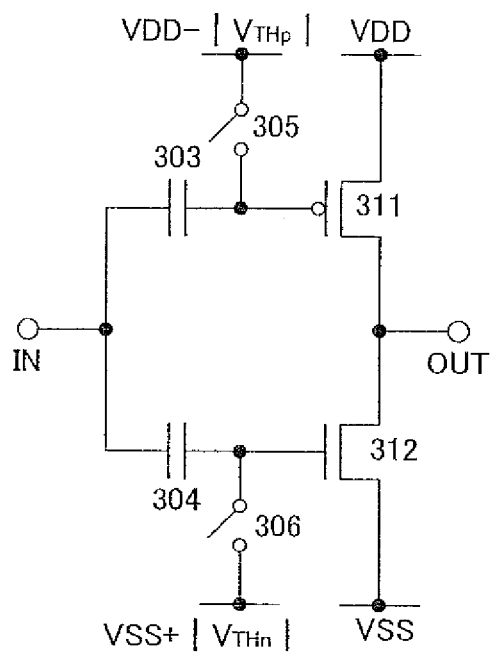
FIGS. 17A to 17D are diagrams showing the operations of an inverter of the invention.

Shown in FIG. 17A is the configuration of an inverter of this embodiment mode. The same reference numerals are given to the same components as those described in FIG. 5. In FIG. 17A, each power supply voltage is optimized so that a charge corresponding to the threshold voltage of the p-channel transistor 311 is accumulated in the first capacitor 303, and a charge corresponding to the threshold voltage of the n-channel transistor 312 is accumulated in the second capacitor 304. In this embodiment mode, a potential which is supplied to the second electrode of the first capacitor 303 by the switch 305 is referred to as VDD−|$V_{THp}$|. Meanwhile, a potential which is supplied to the second electrode of the second capacitor 304 by the switch 306 is VSS+|$V_{THn}$|.

Figure 17B:
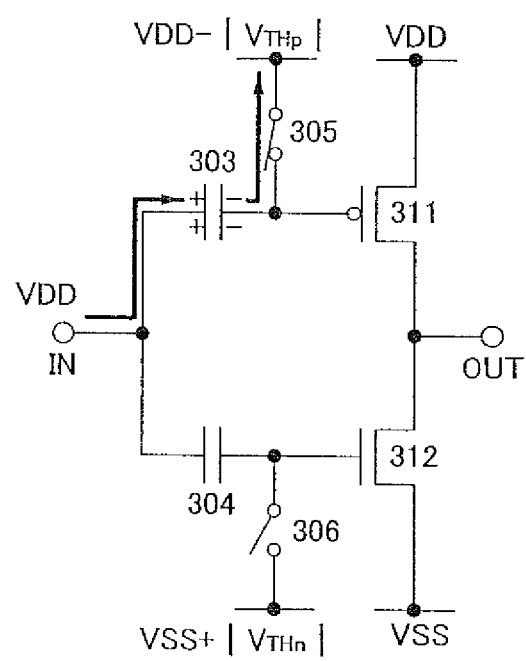

The operation of the inverter shown in FIG. 17A is described with reference to FIGS. 17B to 17D.

First, charges are stored in the first capacitor 303 and in the second capacitor 304. By turning ON the switch 305 and turning OFF the switch 306 as shown in FIG. 17B, and then inputting VDD as an input signal, a threshold voltage of the p-channel transistor 311 is stored in the first capacitor 303. Subsequently, by turning OFF the switch 305, the accumulated charge is held in the first capacitor 303.

Figure 17C:
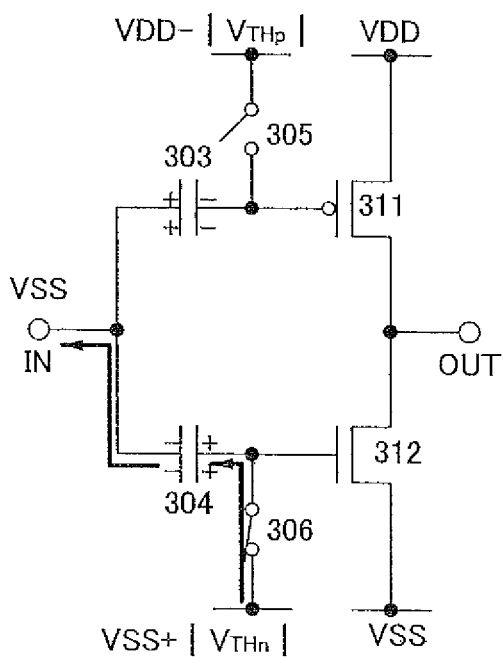

Next, by turning ON the switch 306, and turning OFF the switch 305 as shown in FIG. 17C, and then inputting VSS as an input signal, a threshold voltage of the n-channel transistor 312 is stored in the second capacitor 304. Subsequently, by turning OFF the switch 306, the accumulated charge is held in the second capacitor 304.

Next, an explanation is given on the correction of a potential of an input signal by the stored potential difference, and a normal operation which is performed based on the corrected potential.

Figure 17D:
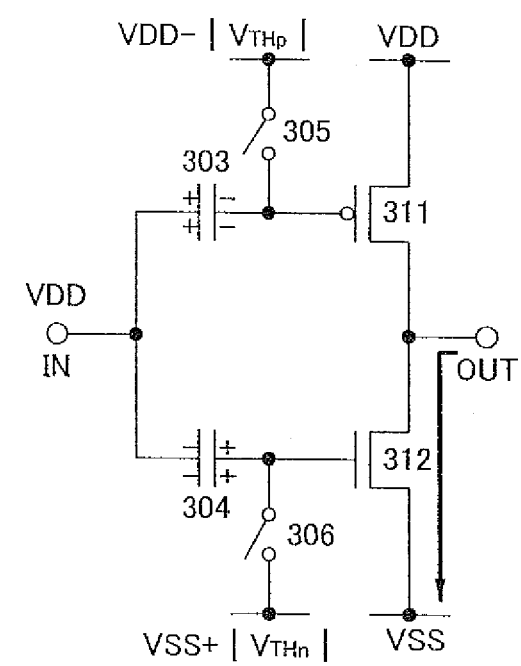

Described below with reference to FIG. 17D is the operation when a potential of an input signal IN is equal to a potential of the power supply potential VDD. In normal operations, the switches 305 and 306 are turned OFF at all times, and a potential of the input signal is supplied to the first electrode of the first capacitor 303 and to the first electrode of the second capacitor 304.

As the threshold voltage subtracted by |$V_{THp}$| ($V_{THp}$−|$V_{THp}$|) is held in the first capacitor 303, and a potential of the second electrode thereof is equal to VDD−|$V_{THp}$|. Therefore, a gate voltage of the p-channel transistor 311 becomes $V_{GSp}$=−|$V_{THp}$|, thus it is turned OFF.

Meanwhile, as the threshold voltage (|$V_{THn}$|) is held in the second capacitor 304, a potential of the second electrode thereof is equal to VDD+|$V_{THn}$|. Therefore, a gate voltage of the n-channel transistor 312 becomes $V_{GSn}$=VDD−VSS+|$V_{THn}$|>|$V_{THn}$|, thus it is turned ON.

Therefore, when the potential of the input signal IN is equal to VDD, the power supply potential VSS is supplied to a subsequent circuit as a potential of an output signal.

Described below is the operation when a potential of the input signal IN is equal to the power supply potential VSS. In normal operations, the switches 305 and 306 are turned OFF as well as the case shown in FIG. 17C. A potential of the input signal is supplied to the first electrode of the first capacitor 303 and to the first electrode of the second capacitor 304.

As the threshold voltage subtracted by |$V_{THp}$| ($V_{THp}$−|$V_{THp}$|) is held in the first capacitor 303, a potential of the second electrode thereof is equal to VSS−|$V_{THp}$|.

Therefore, a gate voltage of the p-channel transistor 311 becomes $V_{GSp}$=VSS−VDD−|$V_{THp}$|<−|$V_{THp}$|, thus it is turned ON.

Meanwhile, as the threshold voltage (|$V_{THn}$|) is held in the second capacitor 304, a potential of the second electrode thereof is equal to VSS+|$V_{THn}$|. Therefore, a gate voltage of the n-channel transistor 312 becomes $V_{GSn}$=|$V_{THn}$|, thus it is turned ON.

Therefore, when the potential of the input signal IN is equal to VSS, the power supply potential VDD is supplied to a subsequent circuit as a potential of an output signal.

According to the embodiment mode, the operation speed of transistors can be improved even when a power supply potential is not sufficiently large relatively to the threshold voltage of each transistor. Thus, the power consumption of the digital circuit can be suppressed.

EMBODIMENT

Embodiments of the invention will be hereinafter described.

Embodiment 1

In this embodiment, the configuration of a clocked inverter and its drive are described in the case where a clocked inverter of the invention is applied to a signal driver circuit of a semiconductor display device.

Figure 9A:
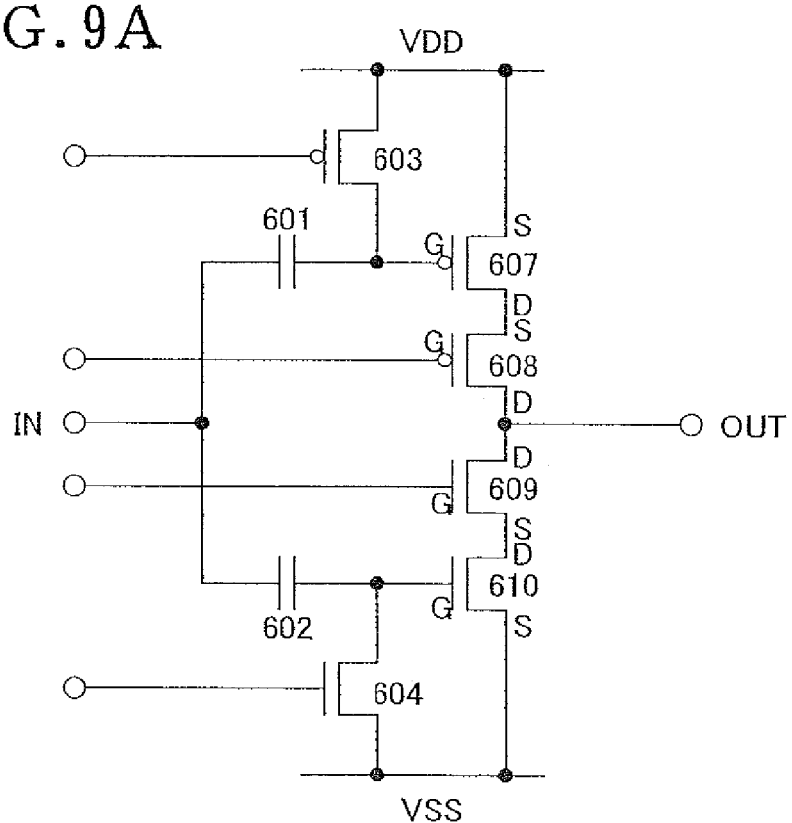
FIGS. 9A and 9B are equivalent circuit diagrams of the clocked inverter shown in FIG. 8A and its timing chart respectively.

Shown in FIG. 9A is the circuit configuration of a clocked inverter used in this embodiment mode. The clocked inverter shown in FIG. 9A corresponds to the one shown in FIG. 8A. Note that, all the switches are substituted by transistors here.

It is to be noted that, described in this embodiment mode is the case of employing the second configuration of the inverter shown in FIG. 1C just as shown in FIG. 5, however, it is also possible to employ the first configuration shown in FIG. 1B just as shown in FIG. 4.

The clocked inverter shown in FIG. 9A comprises a first capacitor 601, a second capacitor 602, p-channel transistors 603, 607 and 608, and n-channel transistors 604, 609 and 610.

The first electrodes of the first capacitor 601 and of the second capacitor 602 are connected to each other, and an input signal IN is supplied to each electrode. The second electrode of the first capacitor 601 is connected to the gate of the p-channel transistor 607. Meanwhile, the second electrode of the second capacitor 602 is connected to the gate of the n-channel transistor 610.

A power supply potential VDD is supplied to the first terminal of the p-channel transistor 603, and the second terminal thereof is connected to the second electrode of the first capacitor 610. A power supply potential VSS is supplied to the first terminal of the n-channel transistor 604, and the second terminal thereof is connected to the second electrode of the second capacitor 602.

The power supply potential VDD is supplied to the first terminal (the source here) of the p-channel transistor 607. The second terminal (the drain here) of the p-channel transistor 607 and the first terminal (the source here) of the p-channel transistor 608 are connected to each other. Meanwhile, the power supply potential VSS is supplied to the first terminal (the source here) of the n-channel transistor 610. The second terminal (the drain here) of the n-channel transistor 610 is connected to the first terminal (the source here) of the n-channel transistor 609. The second terminal (the drain here) of the n-channel transistor 609 is connected to the second terminal (the drain here) of the p-channel transistor 608. It is to be noted that, potentials at the second terminals of the n-channel transistor 609 and of the p-channel transistor 608 are supplied to the subsequent circuit as a potential of an output signal OUT.

Figure 9B:
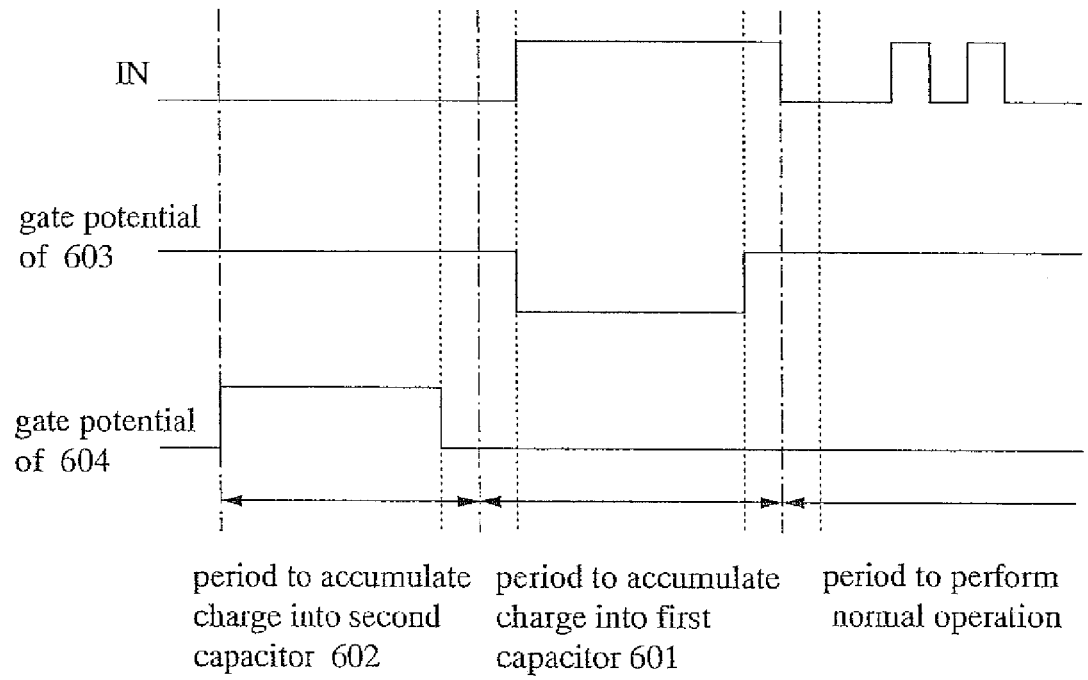

Shown in FIG. 9B is a timing chart showing a potential of the input signal IN, a gate potential of the p-channel transistor 603, and a gate potential of the n-channel transistor 604 during the period to accumulate a charge into the second capacitor 602, the period to accumulate a charge into the first capacitor 601, and the period to perform a normal operation.

As shown in FIG. 9B, in the charge accumulation period into the second capacitor 602, a potential higher than the potential in which the threshold voltage is added to the power supply potential VDD is supplied to the gate of the p-channel transistor 603, thus it is turned OFF. Also, a potential higher than the potential in which the threshold voltage is added to the power supply potential VSS is supplied to the gate of the n-channel transistor 604, thus it is turned ON. A potential of the input signal IN is kept at a potential $V_L$, on the low potential side.

Once a sufficient charge is accumulated into the second capacitor 602, a potential lower than the potential in which the threshold voltage is added to the power supply voltage VSS is supplied to the gate of the n-channel transistor 604, thus it is turned OFF. As a result, the charge is held in the second capacitor 602.

Then, in the charge accumulation period into the first capacitor 601, a potential lower than the potential in which the threshold voltage is added to the power supply potential VDD is supplied to the gate of the p-channel transistor 603, thus it is turned ON. Also, a potential lower than the one in which the threshold voltage in added to the power supply potential VSS is supplied to the gate of the n-channel transistor 604, thus it is turned OFF. A potential of the input signal IN is kept at a potential $V_H$ on the high potential side.

Once a sufficient charge is accumulated into the second capacitor 602, a potential lower than the potential in which the threshold voltage is added to the power supply voltage VSS is supplied to the gate of the p-channel transistor 604, thus it is turned OFF. As a result, the charge is held in the second capacitor 602.

Although the charge accumulation into the first capacitor 601 is preceded by the charge accumulation into the second capacitor 602 in FIG. 9B, the order may be reversed.

That is, the charge accumulation into the second capacitor 602 can be preceded by the charge accumulation into the first capacitor 601.

In the subsequent normal operation period, a potential higher than the potential in which the threshold voltage is added to the power supply potential VDD is supplied to the gate of the p-channel transistor 603, thus it is turned OFF. Also, a potential higher than the potential in which the threshold voltage is added to the power supply potential VSS is supplied to the gate of the n-channel transistor 604, thus it is turned OFF.

Figure 10:
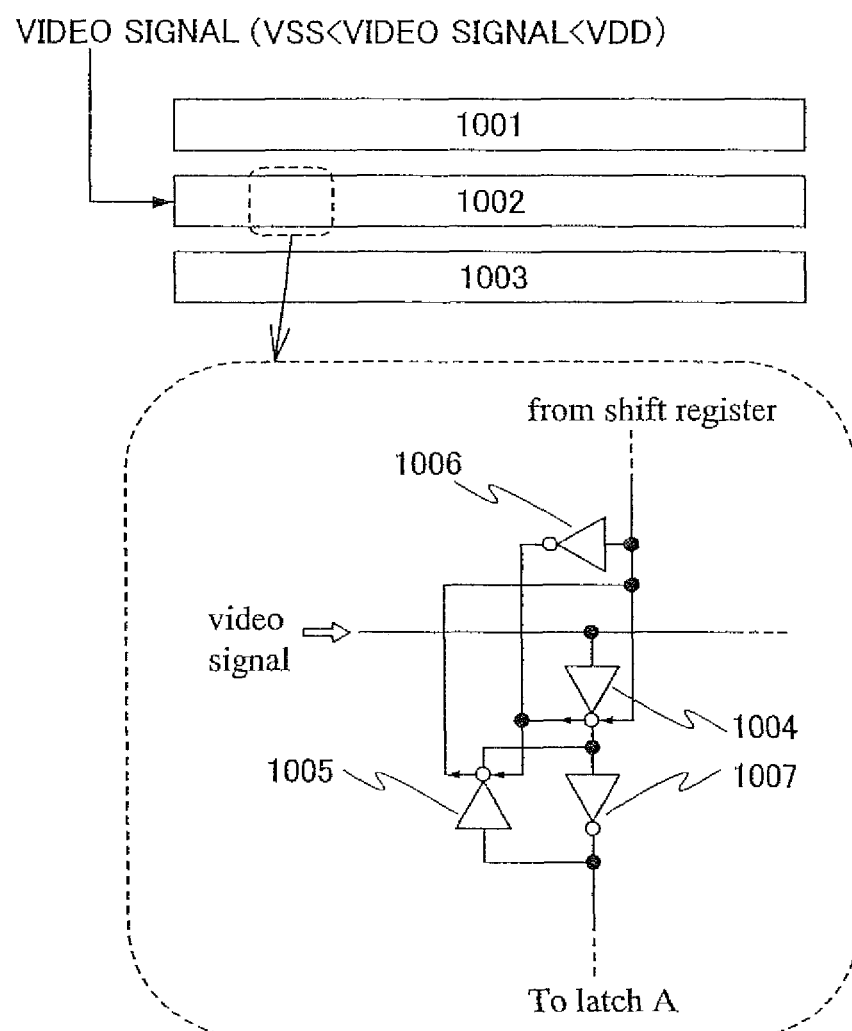
FIG. 10 is a configuration diagram of a signal driver circuit using the clocked inverter shown in FIGS. 9A and 9B.

The configuration of a signal driver circuit to which the clocked inverter of this embodiment is applied is shown in FIG. 10. The signal line driver circuit comprises a shift register 1001, a latch A 1002 and a latch B 1003. The latches A 1002 and B 1003 include a plurality of stages of latches, and the clocked inverter of the invention is used in each latch.

As shown in FIG. 10, specifically, each latch in the latch A 1002 in this embodiment includes a clocked inverter 1004 of the invention, a normal clocked inverter 1005, and two inverters 1006 and 1007.

It is assumed that signals having the same amplitude as that of the power supply are to be inputted to the normal clocked inverter 1005 and two inverters 1006 and 1007. Therefore, a normal circuit may be employed. However, it is also assumed that signals having a small amplitude are inputted as video signals, namely as input signals of the clocked inverter 1004. Therefore, the circuits of the invention as shown in FIGS. 8A, 8B and 9A are needed.

As for the clocked inverter of this embodiment, a video signal corresponds to the input signal IN. Either a timing signal which is supplied from the shift register or a signal obtained by inverting the polarity of the timing signal is inputted to the gate of the p-channel transistor 608, and the other is inputted to the gate of the n-channel transistor 609. The charge accumulation period may be provided during the time when the latch A 1002 is not in operation. For example, it may be provided during a fly-back period or a lighting period of the time gradation system (when drivers are not in operation) and the like.

Otherwise, the timing to accumulate a charge may be controlled by using a signal which is outputted from the shift register 1001 (a sampling pulse). That is, a charge may be accumulated by using a sampling pulse of a plurality of columns earlier.

Figure 11:
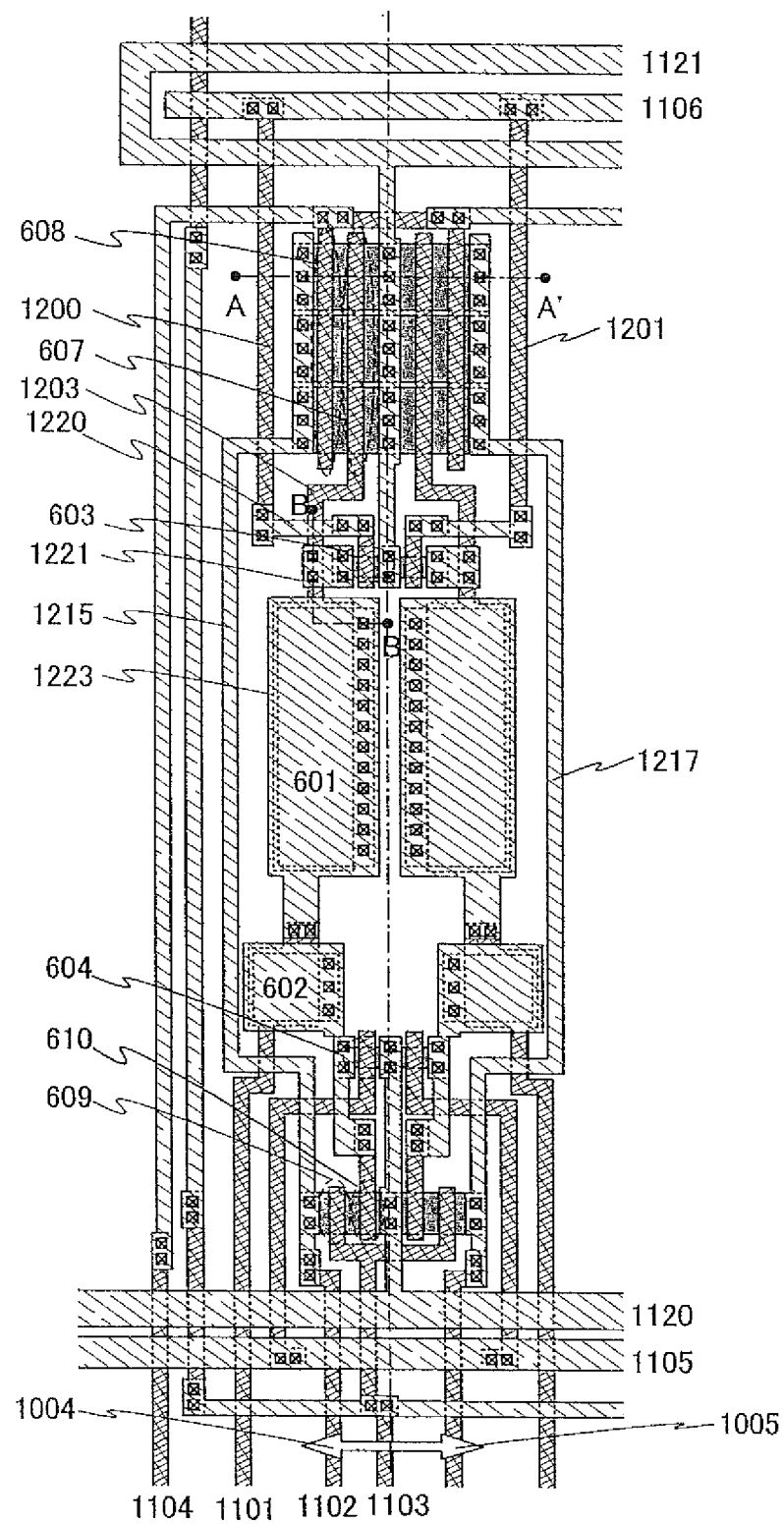
FIG. 11 is a top plan view of the clocked inverter shown in FIGS. 9A and 9B.

A top view of the clocked inverters 1004 and 1005 is shown in FIG. 11. As the configurations of both inverters are almost identical to each other, only the configuration of the clocked inverter 1004 is taken as an example here. Note that, the same reference numerals are given to the same components as those described in FIG. 9A.

The clocked inverter comprises a wiring 1101 to which the input signal IN is inputted, a wiring 1102 from which the output signal OUT is outputted, wiring 1103 which is supplied a potential to the gate of the n-channel transistor 609, a wiring 1104 which is supplied a potential to the gate of the p-channel transistor 608, a wiring 1105 which is supplied a potential to be given to the gate of the n-channel transistor 604, and further a wiring 1106 which is supplied a potential to the gate of the p-channel transistor 603.

Furthermore, a wiring 1120 is supplied the power supply potential VSS and a wiring 1121 is supplied the power supply potential VDD.

Figure 12A:
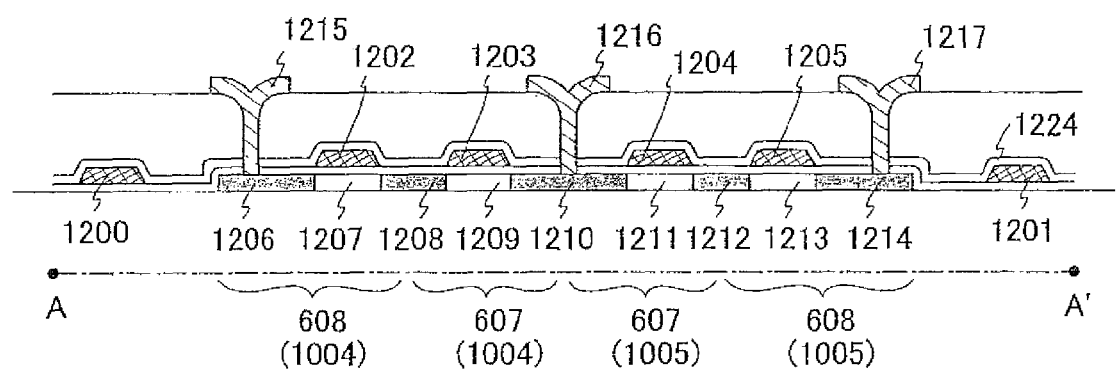
FIGS. 12A and 12B are cross sectional views of FIG. 11.
Figure 12B:
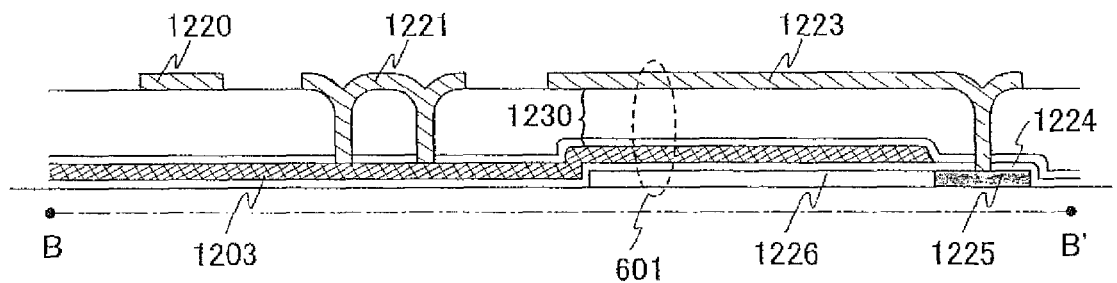
Figure 13A:
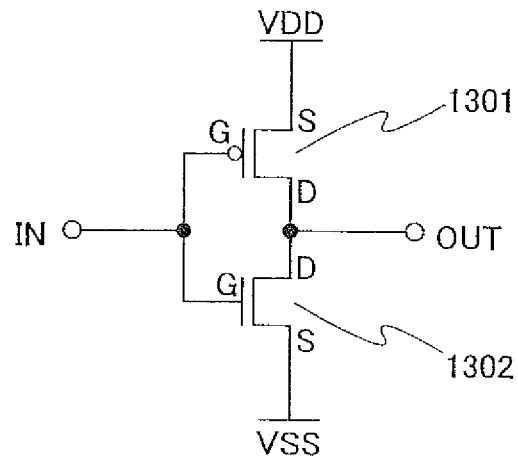
FIGS. 13A to 13C are (schematic) diagrams showing the configurations of a general inverter and its operations.
Figure 13B:
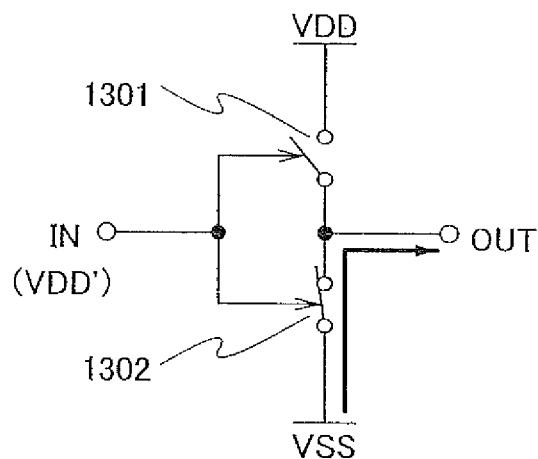
Figure 13C:
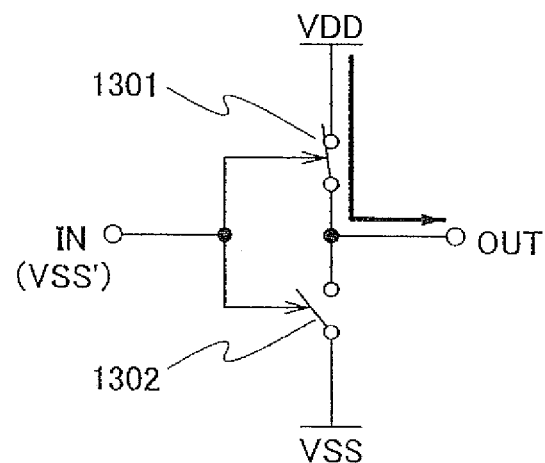
Figure 14A:
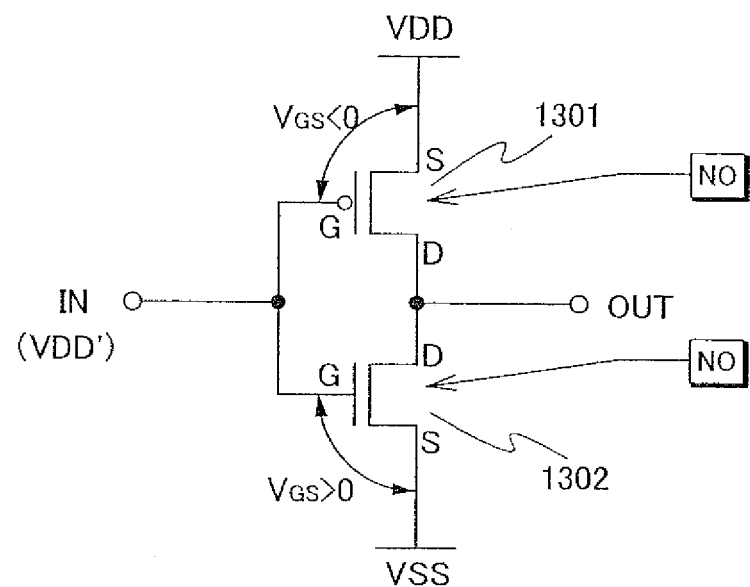
FIGS. 14A and 14B are diagrams of an inverter malfunctioning when a potential of the input signal comes off a desired value.
Figure 14B:
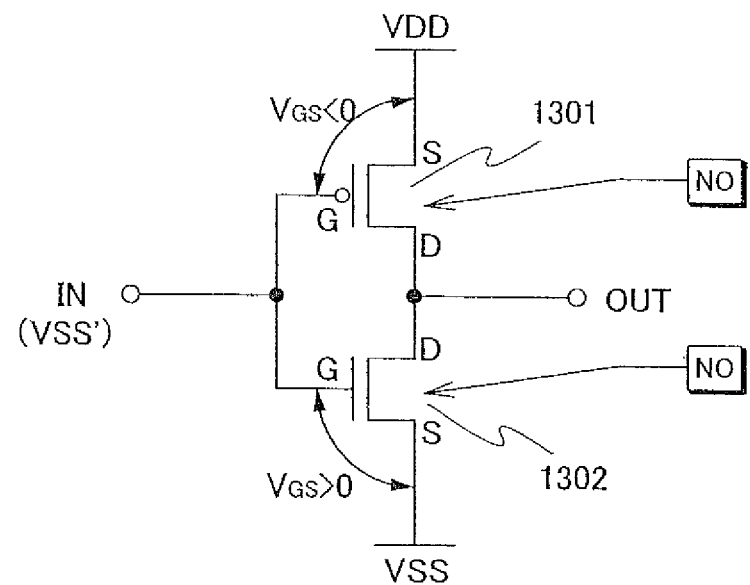

A cross sectional view taken along with a line A-A' in FIG. 11 is shown in FIG. 12A and a cross sectional view taken along with a line B-B' in FIG. 11 is shown in FIG. 12B.

A wiring 1200 and a wiring 1201 are each connected to the wiring 1106, the wiring 1200 is connected to the second terminal of the p-channel transistor 603 via a wiring 1220.

The p-channel transistor 608 in the clocked inverter 1004 includes a channel forming region 1207, impurity regions 1206 and 1208 which correspond to the first or second terminals, a gate electrode 1202 which corresponds to the gate, a gate insulating film 1224 disposed between the channel forming region 1207 and the gate electrode 1202.

The p-channel transistor 607 in the clocked inverter 1004 includes a channel forming region 1209, the impurity regions 1208 and 1210 which correspond to the first or second terminals, a gate electrode 1203 which corresponds to the gate, a gate insulating film 1224 which is disposed between the channel forming region 1209 and the gate electrode 1203.

The p-channel transistor 607 in the clocked inverter 1005 includes a channel forming region 1211, the impurity regions 1210 and 1212 which correspond to the first or second terminals, a gate electrode 1204 which corresponds to the gate, a gate insulating film 1224 which is disposed between the channel forming region 1211 and the gate electrode 1204.

The p-channel transistor 608 in the clocked inverter 1005 includes a channel forming region 1213, the impurity regions 1212 and 1214 which correspond to the first or second terminals, a gate electrode 1205 which corresponds to the gate, a gate insulating film 1224 which is disposed between the channel forming region 1213 and the gate electrode 1205.

The p-channel transistors 608 and 607 in the clocked inverter 1004 have the impurity region 1208 in common. The impurity region 1208 corresponds to the source in the p-channel transistor 608 in the clocked inverter 1004 and corresponds to the drain in the p-channel transistor 607 in the clocked inverter 1004.

The p-channel transistors 608 and 607 in the clocked inverter 1005 have the impurity region 1212 in common. The impurity region 1212 corresponds to the source in the p-channel transistor 608 in the clocked inverter 1005 and corresponds to the drain in the p-channel transistor 607 in the clocked inverter 1005.

The p-channel transistor 607 in the clocked inverter 1004 and the p-channel transistor 607 in the clocked inverter 1005 have the impurity region 1210 in common. The impurity region 1210 corresponds to the source in each transistor.

The impurity region 1206 is connected to a wiring 1215 and the impurity region 1214 is connected to a wiring 1217. The wiring 1215 is connected to the drain of the n-channel transistor 609 in the clocked inverter 1004.

The gate electrode 1203 of the p-channel transistor 607 in the clocked inverter 1004 is connected to the second terminal of the p-channel transistor 603 via the wiring 1221.

A wiring 1223 is connected to an impurity region 1225 in a semiconductor film 1226 of the first capacitor 601. A capacitor formed by overlapping the semiconductor film 1226 and the gate electrode 1203 with a gate insulating film 1224 interposed inbetween, and a capacitor formed by overlapping the gate electrode 1203 and a wiring 1223 with the gate insulating film 1230 interposed inbetween both correspond to the first capacitor 601.

In this manner, capacitors are formed as MOS capacitors. In MOS capacitors, however, the capacitance becomes quite small depending on the higher and lower relation of the potentials at one electrode and another. Therefore, two capacitors are disposed in parallel, and the polarity and the directions of each electrode are inversed so that the capacitors can operate regardless of the higher or lower relation of the potentials.

Capacitors are formed rather large. This is because the voltage of the input signal IN is divided into the one for the capacitor 601 and the other for the gate capacitor of the transistor 607. For example, when the capacitor 601 and the gate capacitor of the transistor 607 have the same capacitance, only half of the amplitude of the input signal IN is supplied to the gate of the transistor 607. Therefore, the capacitor 601 is required to be large. As a standard, it is desirable to form the capacitor 601 five times as large as the gate capacitor of the transistor 607. It is to be noted that, the same can be applied to the relation between the capacitor 602 and the transistor 610.

It is also to be noted that, the clocked inverter which is one of the digital circuits of the invention is not exclusively limited to the configuration shown in FIG. 11. For example, it can be used as a clocked inverter which configures a flip-flop circuit in the shift register 1001. In this case also, the invention may be applied to the portion to which a signal having a small amplitude is inputted as an input signal. Therefore, the clocked inverter shown in FIG. 8A may be adopted since the shift register processes clock signals and their inverted signals each having the small amplitude. In this case, the shift register does not operate during the fly-back period of the inputted video signals, and charges may thus be accumulated during the period.

It is further to be noted that, the clocked inverter as an example of the digital circuits of the invention is not exclusively limited to the configuration shown in FIG. 11.

Embodiment 2

Figure 15:
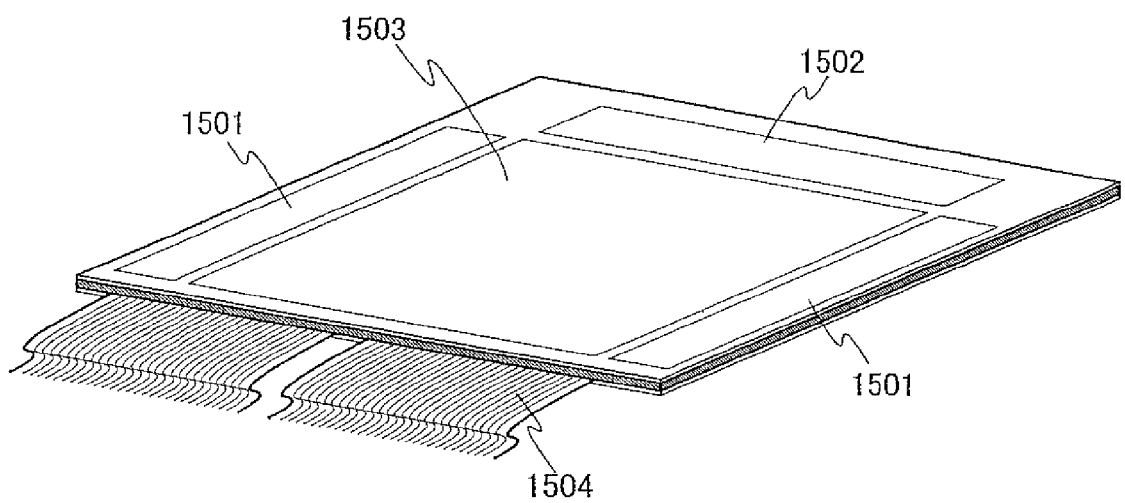
FIG. 15 is an outline view of a semiconductor display device of the invention.

All semiconductor devices using digital circuits of the invention as their driver circuits fall within a category of the invention. An outline view of a semiconductor display device which is one of the semiconductor devices of the invention is shown in FIG. 15. The semiconductor display device shown in FIG. 15 comprises a pixel portion 1503 in which a plurality of pixels are disposed, a scanning driver circuit 1501 which selects pixels, and a signal driver circuit 1502 which supplies video signals to the selected pixels. Furthermore, various types of signals and a power supply potential which are used for driving the pixel portion 1503, the signal driver circuit 1502 and the scanning driver circuit 1501 are supplied through an FPC (Flexible Printed Circuit) 1504.

The semiconductor display device according to the invention includes a liquid crystal display device, a light emitting device which has a light emitting element in each pixel represented by an organic light emitting element, a DMD (Digital Micromirror Device), a PDP (Plasma Display Panel), an FED (Field Emission Display) and the like, and other display devices which have circuit elements formed by using semiconductor films in their driver circuits.

Besides the semiconductor display device, semiconductor devices which fall within a category of the invention include a semiconductor integrated circuit which has one or a plurality of the following circuits: an arithmetic circuit including an adder, an ALU (Arithmetic Logic Circuit), a counter, a multiplier, a shifter and the like, a memory circuit including a flip-flop, a multiport RAM, an FIFO (First In First Out) circuit and the like, a control circuit including a PLA (Programmable Logic Array), and the like.

Embodiment 3

Electronic apparatuses, using semiconductor devices according to the invention, include a video camera, a digital camera, a goggle display (head mounted display), a navigation system, a sound reproduction device (a car audio equipment, an audio set, and the like), a notebook personal computer, a game machine, a portable information device (a mobile computer, a portable telephone, a portable game machine, an electronic book, and the like), an image reproduction apparatus including a recording medium (more specifically, an apparatus which can reproduce a recording medium such as a digital video disc (DVD) and so forth, and includes a display for displaying the reproduced image), or the like. Specific examples of these electronic apparatuses are shown in FIGS. 18A to 18H.

Figure 18A:
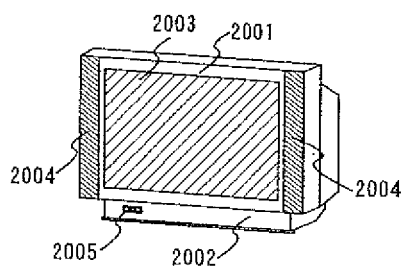
FIGS. 18A to 18H are electronic apparatuses to which a semiconductor device of the invention is applied.

FIG. 18A shows a display device, which includes a housing 2001, a support base 2002, a display portion 2003, a speaker portion 2004, a video input terminal 2005, and the like. By utilizing the light emitting device of the invention for the display portion 2003, the display device of the invention can be provided. The light emitting device can have a thinner display portion than LCDs without a need of a backlight since it is a self-light emitting type. Note that, the light emitting display device includes all the information display devices for personal computers, television broadcast reception, advertisement displays, and the like.

Figure 18B:
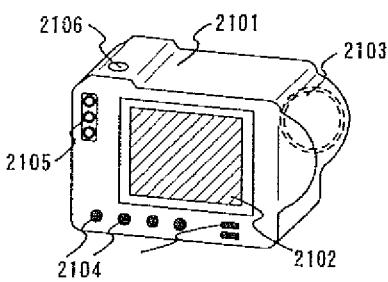

FIG. 18B shows a digital still camera, which includes a main body 2101, a display portion 2102, an image receiving portion 2103, operation keys 2104, an external connection port 2105, a shutter 2106, and the like. By utilizing the light emitting device of the invention for the display portion 2102, the digital still camera of the invention can be provided.

Figure 18C:
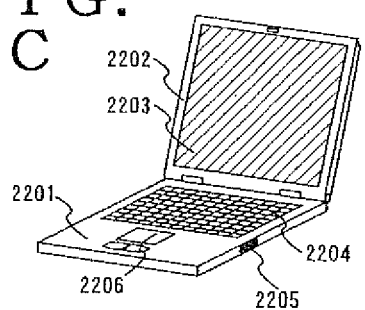

FIG. 18C shows a notebook personal computer, which includes a main body 2201, a housing 2202, a display portion 2203, a key board 2204, an external connection port 2205, a pointing mouse 2206, and the like. By utilizing the light emitting device of the invention for the display portion 2203, the digital still camera of the invention can be provided.

Figure 18D:
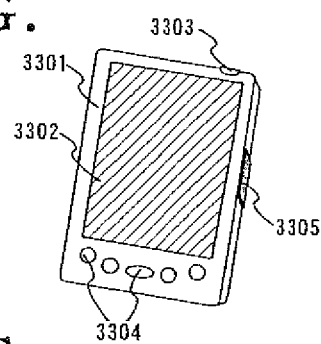

FIG. 18D shows a mobile computer, which includes a main body 2301, a display portion 2302, a switch 2303, operation keys 2304, an infrared port 2305, and the like. By utilizing the light emitting device of the invention for the display portion 2302, the mobile computer of the invention can be provided.

Figure 18E:
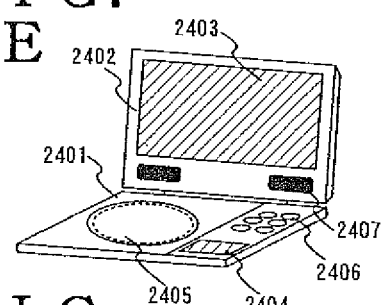

FIG. 18E shows a portable image reproduction device provided with a recording medium (specifically, a DVD playback device), which includes a main body 2401, a frame 2402, a display portion A 2403, a display portion B 2404, a recording medium (such as a DVD) read-in portion 2405, operation keys 2406, a speaker portion 2407, and the like. The display portion A 2403 mainly displays image information and the display portion B 2404 mainly displays character information. Note that, image reproduction devices provided with recording mediums include game machines for domestic use and the like. By utilizing the light emitting device of the invention for the display portions A 2403 and B 2404, the image reproduction device of the invention can be provided.

Figure 18F:
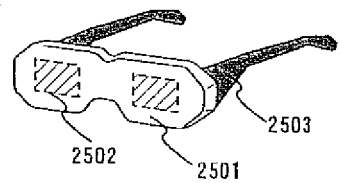

FIG. 18F shows a goggle display (head mounted display), which includes a main body 2501, a display portion 2502, an arm portion 2503, and the like. By utilizing the light emitting device of the invention for the display portion 2502, the goggle display of the invention can be provided.

Figure 18G:
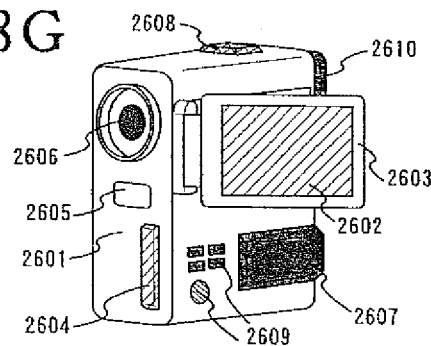

FIG. 18G shows a video camera, which includes a main body 2601, a display portion 2602, a housing 2603, an external connection port 2604, a remote control receiving portion 2605, an image receiving portion 2606, a battery 2607, an audio input portion 2608, operation keys 2609, and the like. By utilizing the light emitting device of the invention for the display portion 2602, the video camera of the invention can be provided.

Figure 18H:
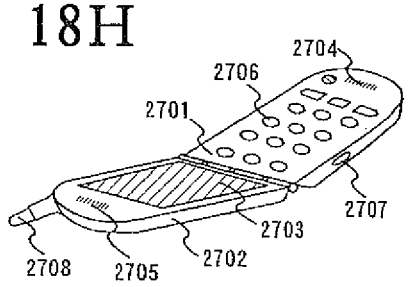

FIG. 18H shows a mobile telephone, which includes a main body 2701, a housing 2702, a display portion 2703, an audio input portion 2704, an audio output portion 2705, operation keys 2706, an external connection port 2707, an antenna 2708, and the like.

Note that, by displaying white characters on a black background of the display portion 2703, the power consumption of the mobile telephone can be suppressed. By utilizing the light emitting device of the invention for the display portion 2703, the mobile telephone of the invention can be provided.

When the brighter luminance of light emitted from the organic light emitting material becomes available in the future, the light emitting device of the invention will be applicable to a front or rear projector in which light including output image information is enlarged by means of lenses or the like.

The aforementioned electronic apparatuses are more likely to be used to display information distributed through a telecommunication path such as Internet, a CATV (cable television system), and in particular to display moving image information. The light emitting device is suitable for displaying moving images since the organic light emitting material can exhibit high response speed.

As a portion that is emitting light in the light emitting device consumes power, it is desirable to display information in such a manner that the light emitting portion therein becomes as small as possible. Therefore, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion is used for the background.

As described above, an application range of the invention is so wide that the invention can be applied to electronic apparatuses in various fields. The electronic apparatuses in this embodiment can employ a light emitting device having any configurations shown in the foregoing embodiment modes and embodiments.

According to the above configuration of the invention, a digital circuit can be operated normally regardless of a potential of an input signal.

Also, when a circuit element includes a transistor and the corrected input signal is inputted to the gate of the transistor, the gate capacitor of the transistor is connected in series with a first capacitor or a second capacitor. That is, the resultant capacitance obtained by the serial connection between the gate capacitor of the transistor and the first capacitor or the second capacitor is smaller than the capacitance obtained by a single gate capacitor of the transistor. Therefore, the delayed operation of the transistor due to the gate capacitor can be prevented.

Although the invention has been fully described in its preferred form with reference to the accompanying drawings, it is to be understood that various changes and modifications are apparent to those skilled in the art. Therefore, unless otherwise such changes and modifications depart from the scope of the invention hereinafter defined, they should be constructed as being included therein.

What is claimed is:

1. A semiconductor device comprising:
   a first wiring;
   a first switch comprising a first terminal and a second terminal; the first terminal of the first switch being electrically connected to the first wiring;
   a second switch comprising a first terminal and a second terminal, the first terminal of the second switch being electrically connected to the second terminal of the first switch;
   a second wiring electrically connected to the second terminal of the second switch;
   a capacitor comprising a first electrode and a second electrode, the first electrode being electrically connected to the second terminal of the first switch;
   a third switch comprising a first terminal and a second terminal, the first terminal being electrically connected to the second electrode of the capacitor;
   a third wiring electrically connected to the second terminal of the third switch;
   a transistor comprising a gate, a first terminal, and a second terminal, the gate being electrically connected to the second electrode of the capacitor and to the first terminal of the third switch, and the first terminal being electrically connected to the third wiring; and a fourth wiring electrically connected to the second terminal of the transistor, wherein an input signal is input to the second terminal of the second switch, wherein the third wiring is configured to be set at a high power supply potential, wherein the fourth wiring is configured to be set at a low power supply potential, wherein the first wiring is configured to be set at a potential lower than the high power supply potential and higher than the low power supply potential, and wherein the second electrode of the capacitor, the first terminal of the third switch, and the gate of the transistor are directly connected to a same electrical node.

2. The semiconductor device according to claim 1, wherein the first wiring, the second wiring, the third wiring, the first switch, the second switch, the third switch, and the capacitor are included in a digital circuit.

3. The semiconductor device according to claim 1, wherein the first wiring, the second wiring, the third wiring, the first switch, the second switch, the third switch, and the capacitor form a correction unit.

4. A display device comprising the semiconductor device according to claim 1.

5. A light emitting display device comprising the semiconductor device according to claim 1.

6. A semiconductor device comprising:
a first wiring;
a first switch comprising a first terminal and a second terminal; the first terminal of the first switch being electrically connected to the first wiring;
a second switch comprising a first terminal and a second terminal, the first terminal of the second switch being electrically connected to the second terminal of the first switch;
a second wiring electrically connected to the second terminal of the second switch;
a capacitor comprising a first electrode and a second electrode, the first electrode being electrically connected to the second terminal of the first switch;
a third switch comprising a first terminal and a second terminal, the first terminal being electrically connected to the second electrode of the capacitor;
a third wiring electrically connected to the second terminal of the third switch;
a transistor comprising a gate, a first terminal, and a second terminal, the gate being electrically connected to the second electrode of the capacitor and to the first terminal of the third switch, and the first terminal being electrically connected to the third wiring; and
a fourth wiring electrically connected to the second terminal of the transistor,
wherein an input signal is input to the second terminal of the second switch, and
wherein the second electrode of the capacitor, the first terminal of the third switch, and the gate of the transistor are directly connected to a same electrical node.

7. A semiconductor device according to claim 6, further comprising:
a fourth switch comprising a first terminal and a second terminal; the first terminal of the fourth switch being electrically connected to the first wiring;
a fifth switch comprising a first terminal and a second terminal, the first terminal of the fifth switch being electrically connected to the second terminal of the fourth switch;
a fifth wiring electrically connected to the second terminal of the fifth switch;
another capacitor comprising a first electrode and a second electrode, the first electrode being electrically connected to the second terminal of the fourth switch;
a sixth switch comprising a first terminal and a second terminal, the first terminal being electrically connected to the second electrode of the other capacitor;
a sixth wiring electrically connected to the second terminal of the sixth switch; and
another transistor comprising a gate, a first terminal, and a second terminal, the gate being electrically connected to the second electrode of the other capacitor, the first terminal being electrically connected to the sixth wiring; and the second terminal being electrically connected to the fourth wiring.

8. The semiconductor device according to claim 6, wherein the first wiring, the second wiring, the third wiring, the first switch, the second switch, the third switch, the capacitor, and the transistor are included in a digital circuit.

9. The semiconductor device according to claim 6, wherein the first wiring, the second wiring, the third wiring, the first switch, the second switch, the third switch, and the capacitor form a correction unit.

10. The semiconductor device according to claim 6, configured so that:
the first wiring is to be input with a first digital signal, and
the fourth wiring is to output a second digital signal.

11. The semiconductor device according to claim 6, configured so that:
the second wiring is to be put at a high potential, and
the third wiring is to be put at a high power supply potential greater than the high potential.

12. A display device comprising the semiconductor device according to claim 6.

13. A display device comprising the semiconductor device according to claim 6,
further comprising organic light emitting elements in a pixel portion,
wherein the first wiring, the second wiring, the third wiring, the first switch, the second switch, the third switch, the capacitor, and the transistor are comprised in a driver circuit.

14. A display device comprising:
a pixel portion;
a scanning driver circuit;
a signal driver circuit;
a first wiring;
a first switch comprising a first terminal and a second terminal; the first terminal of the first switch being electrically connected to the first wiring;
a second switch comprising a first terminal and a second terminal, the first terminal of the second switch being electrically connected to the second terminal of the first switch;
a second wiring electrically connected to the second terminal of the second switch;
a capacitor comprising a first electrode and a second electrode, the first electrode being electrically connected to the second terminal of the first switch;
a third switch comprising a first terminal and a second terminal, the first terminal being electrically connected to the second electrode of the capacitor;

a third wiring electrically connected to the second terminal of the third switch;

a transistor comprising a gate, a first terminal, and a second terminal, the gate being electrically connected to the second electrode of the capacitor and to the first terminal of the third switch, and the first terminal being electrically connected to the third wiring; and a fourth wiring electrically connected to the second terminal of the transistor, wherein an input signal is input to the second terminal of the second switch, and wherein the second electrode of the capacitor, the first terminal of the third switch, and the gate of the transistor are directly connected to a same electrical node.

15. A display device according to claim 14, further comprising:

a fourth switch comprising a first terminal and a second terminal; the first terminal of the fourth switch being electrically connected to the first wiring;

a fifth switch comprising a first terminal and a second terminal, the first terminal of the fifth switch being electrically connected to the second terminal of the fourth switch;

a fifth wiring electrically connected to the second terminal of the fifth switch;

another capacitor comprising a first electrode and a second electrode, the first electrode being electrically connected to the second terminal of the fourth switch;

a sixth switch comprising a first terminal and a second terminal, the first terminal being electrically connected to the second electrode of the other capacitor;

a sixth wiring electrically connected to the second terminal of the sixth switch; and another transistor comprising a gate, a first terminal, and a second terminal, the gate being electrically connected to the second electrode of the other capacitor, the first terminal being electrically connected to the sixth wiring; and the second terminal being electrically connected to the fourth wiring.

16. The display device according to claim 14, wherein the first wiring, the second wiring, the third wiring, the first switch, the second switch, the third switch, the capacitor, and the transistor are comprised in a digital circuit.

17. The display device according to claim 14, wherein the first wiring, the second wiring, the third wiring, the first switch, the second switch, the third switch, and the capacitor form a correction unit.

18. The display device according to claim 14, wherein the first wiring, the second wiring, the third wiring, the first switch, the second switch, the third switch, the capacitor, and the transistor are included in an inverter circuit.

19. The display device according to claim 14, wherein the first wiring, the second wiring, the third wiring, the first switch, the second switch, the third switch, the capacitor, and the transistor are included in a driver circuit.

20. The display device according to claim 14, configured so that:

the first wiring is to be input with a first digital signal, and the fourth wiring is to output a second digital signal.

21. The display device according to claim 14, configured so that:

the second wiring is to be put at a high potential, and the third wiring is to be put at a high power supply potential greater than the high potential.

22. The display device according to claim 14, further comprising organic light emitting elements in the pixel portion.

* * * * *